(12) United States Patent
Chen

(10) Patent No.: US 12,388,038 B2
(45) Date of Patent: Aug. 12, 2025

(54) SEMICONDUCTOR PACKAGES INCLUDING MIXED BOND TYPES AND METHODS OF FORMING SAME

(71) Applicant: Taiwan Semiconductor Manufacturing Co., Ltd., Hsinchu (TW)

(72) Inventor: Ming-Fa Chen, Taichung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 637 days.

(21) Appl. No.: 17/825,042

(22) Filed: May 26, 2022

(65) Prior Publication Data

US 2023/0335519 A1 Oct. 19, 2023

Related U.S. Application Data

(60) Provisional application No. 63/362,924, filed on Apr. 13, 2022.

(51) Int. Cl.
*H01L 23/00* (2006.01)
*H01L 23/498* (2006.01)
(Continued)

(52) U.S. Cl.
CPC ........ *H01L 24/08* (2013.01); *H01L 23/49816* (2013.01); *H01L 23/49822* (2013.01); *H01L 23/49833* (2013.01); *H01L 23/49838* (2013.01); *H01L 24/16* (2013.01); *H01L 24/32* (2013.01); *H01L 24/73* (2013.01); *H01L 24/80* (2013.01); *H01L 24/81* (2013.01); *H01L 25/0652* (2013.01); *H01L 25/105* (2013.01); *H01L 21/4857* (2013.01); *H01L 21/486* (2013.01); *H01L 23/5381* (2013.01);
(Continued)

(58) Field of Classification Search
CPC ............... H01L 24/08; H01L 23/49816; H01L 23/49822
See application file for complete search history.

(56) References Cited

U.S. PATENT DOCUMENTS 8,987,922 B2 3/2015 Yu et al.
8,993,380 B2 3/2015 Hou et al.
(Continued)

FOREIGN PATENT DOCUMENTS

KR 20180114491 A 10/2018
KR 20210057853 A 5/2021
(Continued)

*Primary Examiner* — Errol V Fernandes
(74) *Attorney, Agent, or Firm* — Slater Matsil, LLP

(57) ABSTRACT

A semiconductor package including hybrid bonding and solder bonding along a first interface and methods of forming the same are disclosed. In an embodiment, a package includes a first interposer, the first interposer including a first redistribution structure; a first die bonded to a first surface of the first redistribution structure with a dielectric-to-dielectric bond and a metal-to-metal bond; a second die bonded to the first surface of the first redistribution structure with a first solder bond; an encapsulant around the first die and the second die; and a plurality of conductive connectors on a second side of the first redistribution structure opposite to the first die and the second die.

20 Claims, 26 Drawing Sheets

(51) Int. Cl.
   *H01L 25/065*   (2023.01)
   *H01L 25/10*    (2006.01)
   *H01L 21/48*        (2006.01)
   *H01L 23/538*       (2006.01)

(52) U.S. Cl.
   CPC ...... *H01L 23/5385* (2013.01); *H01L 23/5386* (2013.01); *H01L 2224/08235* (2013.01); *H01L 2224/08237* (2013.01); *H01L 2224/16227* (2013.01); *H01L 2224/16237* (2013.01); *H01L 2224/32225* (2013.01); *H01L 2224/73204* (2013.01); *H01L 2224/80895* (2013.01); *H01L 2224/80896* (2013.01); *H01L 2224/81815* (2013.01); *H01L 2924/1431* (2013.01); *H01L 2924/1434* (2013.01); *H01L 2924/182* (2013.01); *H01L 2924/37001* (2013.01)

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,196,532 B2 | 11/2015 | Tu et al. |
| 9,196,559 B2 | 11/2015 | Tsai et al. |
| 9,257,333 B2 | 2/2016 | Lu et al. |
| 9,263,511 B2 | 2/2016 | Yu et al. |
| 9,263,839 B2 | 2/2016 | Chen et al. |
| 9,275,924 B2 | 3/2016 | Wang et al. |
| 9,275,925 B2 | 3/2016 | Chen et al. |
| 9,281,254 B2 | 3/2016 | Yu et al. |
| 9,299,649 B2 | 3/2016 | Chiu et al. |
| 9,368,460 B2 | 6/2016 | Yu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,559,081 B1 * | 1/2017 | Lai ............ H01L 23/5389 |
| 9,666,502 B2 | 5/2017 | Chen et al. |
| 9,735,131 B2 | 8/2017 | Su et al. |
| 10,535,633 B2 * | 1/2020 | Wei ............... H01L 25/18 |
| 11,101,209 B2 | 8/2021 | Liu et al. |
| 11,469,166 B2 | 10/2022 | Chen et al. |
| 11,658,148 B2 | 5/2023 | Lee et al. |
| 11,728,254 B2 | 8/2023 | Hou et al. |
| 2013/0168857 A1 * | 7/2013 | Gregorich ...... H01L 25/0655 257/E23.021 |
| 2020/0111729 A1 | 4/2020 | Pan et al. |
| 2020/0343218 A1 * | 10/2020 | Hu ................. H01L 24/80 |
| 2021/0143126 A1 | 5/2021 | Choi et al. |
| 2022/0262751 A1 | 8/2022 | Zhang et al. |
| 2022/0336318 A1 * | 10/2022 | Lin ............... H01L 21/4882 |

FOREIGN PATENT DOCUMENTS

| | | |
|---|---|---|
| KR | 20210145063 A | 12/2021 |
| TW | 201916304 A | 4/2019 |
| TW | 202119587 A | 5/2021 |
| WO | 2021081855 A1 | 5/2021 |

\* cited by examiner

SEMICONDUCTOR PACKAGES INCLUDING MIXED BOND TYPES AND METHODS OF FORMING SAME

CROSS-REFERENCE TO RELATED APPLICATIONS

This application claims the benefit of U.S. Provisional Application No. 63/362,924, filed on Apr. 13, 2022, which application is hereby incorporated herein by reference.

BACKGROUND

The semiconductor industry has experienced rapid growth due to ongoing improvements in the integration density of a variety of electronic components (e.g., transistors, diodes, resistors, capacitors, and the like). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged.

As semiconductor technologies further advance, stacked and bonded semiconductor devices have emerged as an effective alternative to further reduce the physical size of a semiconductor device. In a stacked semiconductor device, active circuits such as logic, memory, processor circuits and the like are fabricated at least partially on separate substrates and then physically and electrically bonded together in order to form a functional device. Such bonding processes utilize sophisticated techniques, and improvements are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
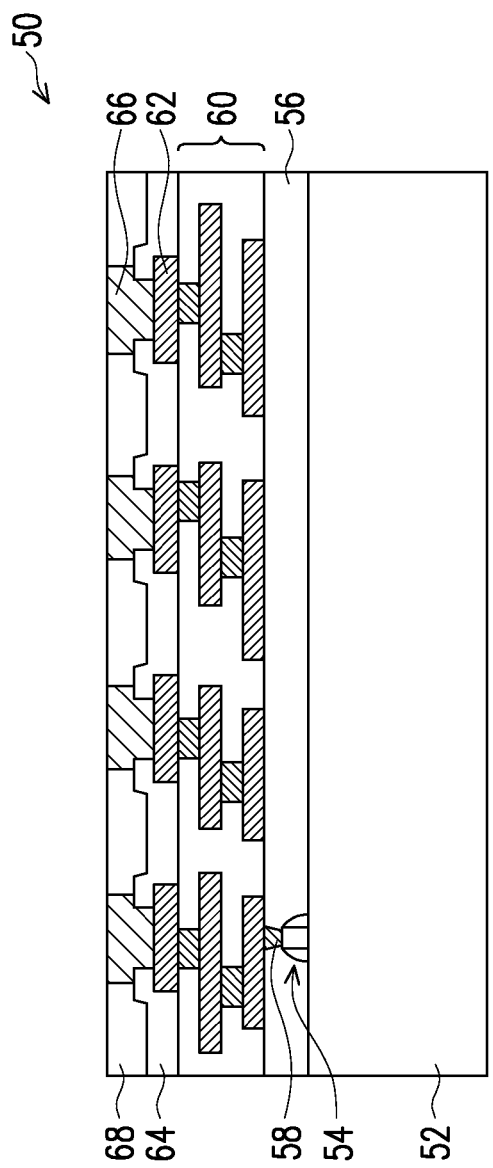
FIG. 1 illustrates a cross-sectional view of an integrated circuit die in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide packaged semiconductor devices including mixed bond types at a single interface and methods of forming the same. The method includes hybrid bonding a first die to an interface die and solder bonding a second die to the interface die adjacent the first die. A molding compound may be formed around the first die and the second die, and surfaces of the first die, the second die, and the molding compound may be planarized. In some embodiments, the first die may be a logic die and the second die may be a memory die. In some embodiments, the second die may be a logic die, a passive device die, or a bridge die. The first die and the second die may be electrically coupled to one another through redistribution layers of the interface die. Bonding the first die to the interface die using hybrid bonding allows smaller pitch connections to be formed between the first die and the interface die, reduces the form factor of packages including the first die and the interface die, and improves device performance. Bonding the second die to the interface die using solder bonding reduces costs.

FIG. 1 illustrates a cross-sectional view of an integrated circuit die 50, in accordance with some embodiments. The integrated circuit die 50 will be packaged in subsequent processing to form an integrated circuit package. The integrated circuit die 50 may be a logic die (e.g., a central processing unit (CPU), a graphics processing unit (GPU), a system-on-a-chip (SoC), an application processor (AP), a microcontroller, or the like); a memory die (e.g., a dynamic random access memory (DRAM) die, a static random access memory (SRAM) die, a NAND flash memory die, or the like); a power management die (e.g., a power management integrated circuit (PMIC) die); a radio frequency (RF) die; a sensor die; a micro-electro-mechanical-system (MEMS) die; a signal processing die (e.g., a digital signal processing (DSP) die); a front-end die (e.g., an analog front-end (AFE) die); an input-output (IO) die; a bridge die; the like; or a combination thereof.

The integrated circuit die 50 may be formed in a wafer, which may include different device regions that are singulated in subsequent steps to form a plurality of integrated circuit dies. The integrated circuit die 50 may be processed according to applicable manufacturing processes to form integrated circuits. In some embodiments, the integrated circuit die 50 includes a semiconductor substrate 52, such as silicon, doped or un-doped, or an active layer of a semiconductor-on-insulator (SOI) substrate. The semiconductor substrate 52 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may be used. The semiconductor substrate 52 has an active surface (e.g., the surface facing upwards in FIG. 1), sometimes referred to as a front-side, and an inactive surface (e.g., the surface facing downwards in FIG. 1), sometimes referred to as a backside.

Devices (represented by a transistor) 54 may be formed at the front-side of the semiconductor substrate 52. The devices 54 may be active devices (e.g., transistors, diodes, or the like), capacitors, resistors, or the like. An inter-layer dielectric (ILD) 56 is on the front-side of the semiconductor substrate 52. The ILD 56 surrounds and may cover the devices 54. The ILD 56 may include one or more dielectric layers formed of materials such as phosphosilicate glass (PSG), boro-silicate glass (BSG), boron-doped phosphosilicate glass (BPSG), un-doped silicate glass (USG), or the like.

Conductive plugs 58 extend through the ILD 56, and are electrically and physically coupled to the devices 54. In embodiments in which the devices 54 are transistors, the conductive plugs 58 may be coupled to gates and source/drain regions (e.g., source region and/or drain regions) of the transistors. The conductive plugs 58 may be formed of tungsten, cobalt, nickel, copper, silver, gold, aluminum, the like, or combinations thereof. An interconnect structure 60 is formed on the ILD 56 and conductive plugs 58. The interconnect structure 60 interconnects the devices 54 to form integrated circuits. In some embodiments, the interconnect structure 60 may be formed by metallization patterns in dielectric layers on the ILD 56. The metallization patterns include metal lines and vias formed in one or more low-k dielectric layers. The metallization patterns of the interconnect structure 60 are electrically coupled to the devices 54 by the conductive plugs 58.

The integrated circuit die 50 further includes pads 62, such as aluminum pads, to which external connections are made. The pads 62 are on the front-side of the semiconductor substrate 52, such as in and/or on the interconnect structure 60. One or more passivation films 64 are on the integrated circuit die 50, such as on portions of the interconnect structure 60 and the pads 62. Openings extend through the passivation films 64 to the pads 62. Die connectors 66, such as conductive pillars (e.g., formed of a metal such as copper), extend through the openings in the passivation films 64. The die connectors 66 may be physically and electrically coupled to respective ones of the pads 62. The die connectors 66 may be formed by plating, or the like. The die connectors 66 are electrically coupled to the integrated circuits of the integrated circuit die 50.

Solder regions (e.g., solder balls or solder bumps) may be disposed on the pads 62. The solder balls may be used to perform chip probe (CP) testing on the integrated circuit die 50. CP testing may be performed on the integrated circuit die 50 to ascertain whether the integrated circuit die 50 is a known good die (KGD). Thus, only integrated circuit dies 50, which are KGDs, undergo subsequent processing and are packaged. Dies that fail the CP testing, are not packaged. After testing, the solder regions may be removed in subsequent processing steps.

A dielectric layer 68 may (or may not) be on the front-side of the semiconductor substrate 52, such as on the passivation films 64 and the die connectors 66. The dielectric layer 68 laterally encapsulates the die connectors 66, and the dielectric layer 68 is laterally coterminous with the semiconductor substrate 52. Initially, the dielectric layer 68 may bury the die connectors 66, such that the topmost surface of the dielectric layer 68 is above the topmost surfaces of the die connectors 66. In embodiments in which the solder regions are disposed on the die connectors 66, the dielectric layer 68 may bury the solder regions as well. Alternatively, the solder regions may be removed prior to forming the dielectric layer 68.

The dielectric layer 68 may be a polymer such as PBO, polyimide, BCB, or the like; a nitride such as silicon nitride or the like; an oxide such as silicon oxide, PSG, BSG, BPSG, or the like; the like, or a combination thereof. The dielectric layer 68 may be formed by spin coating, lamination, chemical vapor deposition (CVD), or the like. In some embodiments, the die connectors 66 are exposed through the dielectric layer 68 during formation of the integrated circuit die 50. In some embodiments, the die connectors 66 remain buried and are exposed during a subsequent process for packaging the integrated circuit die 50. Exposing the die connectors 66 may remove any solder regions that may be present on the die connectors 66.

In some embodiments, the integrated circuit die 50 is a stacked device that includes multiple semiconductor substrates 52. For example, the integrated circuit die 50 may be a memory device, such as a hybrid memory cube (HMC) module, a high bandwidth memory (HBM) module, or the like that includes multiple memory dies. In such embodiments, the integrated circuit die 50 includes multiple semiconductor substrates 52 interconnected by through-substrate vias (TSVs). Each of the semiconductor substrates 52 may (or may not) have an interconnect structure 60.

FIGS. 2 through 11 illustrate cross-sectional views of intermediate steps during a process for forming a first packaged component 200 (illustrated in FIG. 11), in accordance with some embodiments. One or more of the integrated circuit dies 50 may be packaged to form the first packaged component 200. The first packaged component 200 may be referred to as a chip-on-wafer-on-substrate (CoWoS) package or a system on integrated chip (SoIC) package.

Figure 2:
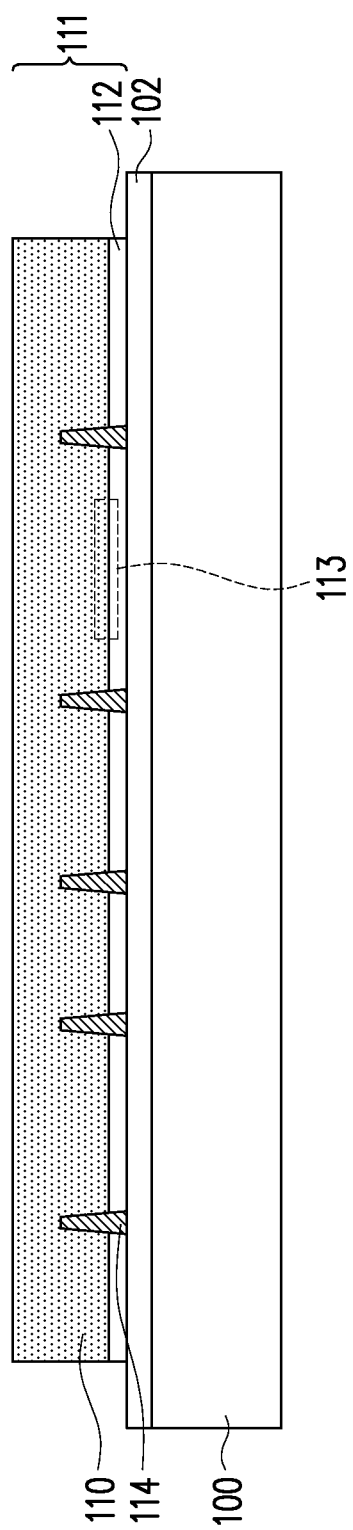
FIGS. 2 through 26 illustrate cross-sectional views of intermediate steps during a process for forming a package component in accordance with some embodiments.

In FIG. 2, an interface die 111 is attached to a carrier substrate 100. The carrier substrate 100 may be a glass carrier substrate, a ceramic carrier substrate, or the like. The carrier substrate 100 may be a wafer, such that multiple packages can be formed on the carrier substrate 100 simultaneously. Although the interface die 111 is described as a die, the interface die 111 may be a wafer, which may be subsequently singulated.

A release layer 102 is formed on the carrier substrate 100. The release layer 102 may be formed of a polymer-based material, which may be removed along with the carrier substrate 100 from the interface die 111 in subsequent steps. In some embodiments, the release layer 102 is an epoxy-based thermal-release material, which loses its adhesive property when heated, such as a light-to-heat-conversion (LTHC) release coating. In some embodiments, the release layer 102 may be an ultra-violet (UV) glue, which loses its adhesive property when exposed to UV radiation, such as radiation from UV lights. The release layer 102 may be dispensed as a liquid and cured, may be a laminate film laminated onto the carrier substrate 100, or the like. A top surface of the release layer 102 may be leveled and may have a high degree of planarity.

The interface die 111 may include an interface substrate 110, a dielectric layer 112 on the interface substrate 110, and conductive vias 114 in the dielectric layer 112 and the interface substrate 110. The interface substrate 110 may be a bulk semiconductor substrate, a semiconductor-on-insulator (SOI) substrate, a multi-layered semiconductor substrate, or the like. The interface substrate 110 may include a semiconductor material, such as silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as multi-layered or gradient substrates, may also be used. The interface substrate 110 may be doped or un-doped. In some embodiments the interface substrate 110 is free from active devices, although the interface substrate 110 may include passive devices formed in and/or on a front surface of the interface substrate 110 (e.g., the surface facing downwards in FIG. 2), sometimes referred to as a front-side. In embodiments where integrated circuits are formed in the interface substrate 110, active devices 113 such as transistors, diodes, and the like, as well as passive devices such as capacitors, resistors, and the like, may be formed in and/or on the front-side of the interface substrate 110.

The dielectric layer 112 may be formed on the interface substrate 110. In some embodiments, the dielectric layer 112 is formed of a polymer, which may be a photo-sensitive material such as PBO, polyimide, BCB, or the like, that may be patterned using a lithography mask. In some embodiments, the dielectric layer 112 is formed of a nitride such as silicon nitride; an oxide such as silicon oxide, PSG, BSG, BPSG; or the like. The dielectric layer 112 may be formed by spin coating, lamination, CVD, the like, or a combination thereof.

In some embodiments, the conductive vias 114 may be formed by forming recesses (not separately illustrated) in the dielectric layer 112 and the interface substrate 110. The recesses may be formed by etching, milling, laser techniques, a combination thereof, or the like. A dielectric material may be formed in the recesses, such as by using an oxidation technique. A barrier layer may be conformally deposited in the openings, such as by CVD, atomic layer deposition (ALD), physical vapor deposition (PVD), thermal oxidation, a combination thereof, or the like. The barrier layer may be formed of an oxide, a nitride, a carbide, a combination thereof, or the like. A conductive material may be deposited over the barrier layer and in the recesses. The conductive material may be formed by an electro-chemical plating process, CVD, ALD, PVD, a combination thereof, or the like. Examples of conductive materials include copper, tungsten, aluminum, silver, gold, a combination thereof, or the like. Excess materials of the conductive material, the barrier layer, and the dielectric material may be removed from surfaces of the dielectric layer 112 using a planarization process. The planarization process may be, for example, a chemical-mechanical polish (CMP), a grinding process, an etch-back process, or the like. Remaining portions of the barrier layer and the conductive material form the conductive vias 114.

Figure 3:
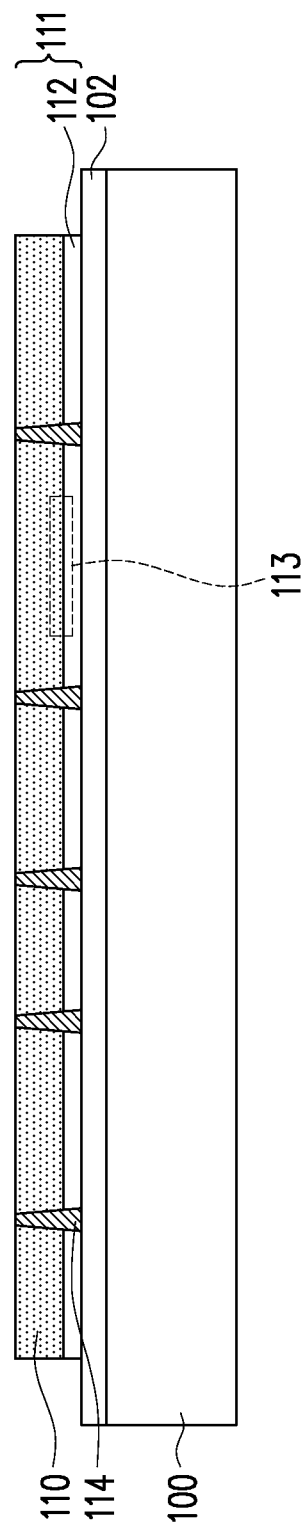

In FIG. 3, the backside of the interface substrate 110 is thinned. The interface substrate 110 may be thinned by a planarization process applied to the interface substrate 110 to expose the conductive vias 114. After the conductive vias 114 are exposed, the conductive vias 114 extend through the interface substrate 110 and may be referred to as TSVs. The planarization may remove portions of the interface substrate 110 opposite the dielectric layer 112 such that the conductive vias 114 are exposed. The planarization may be achieved by any suitable process, such as a CMP, a grinding process, an etch-back process, the like, or a combination thereof. After the planarization, the conductive vias 114 may extend completely through the interface substrate 110 and provide interconnection between opposite sides of the interface substrate 110.

Figure 4:
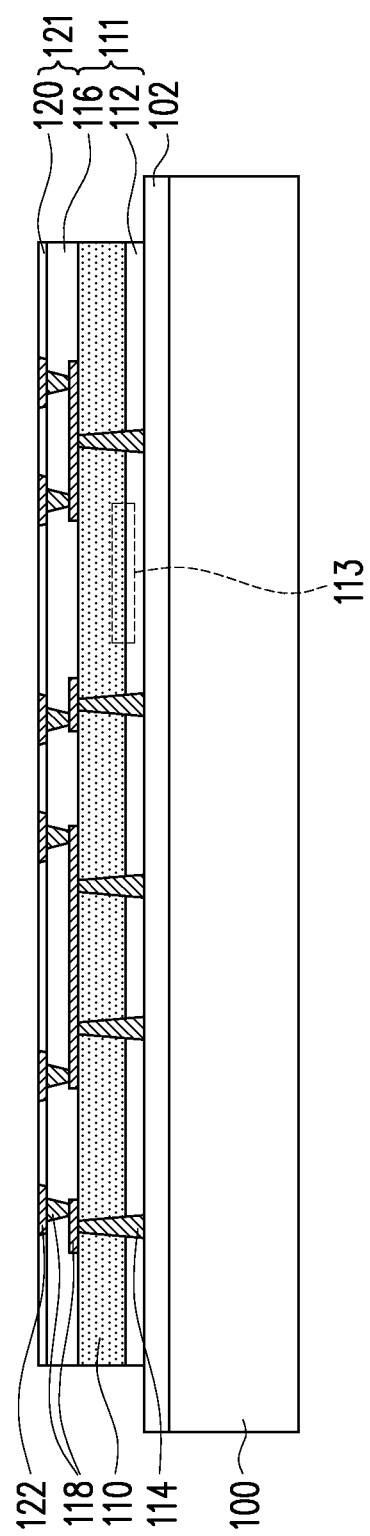

In FIG. 4, a backside interconnect structure 121 is formed on the interface substrate 110. The backside interconnect structure 121 includes dielectric layers 116, metallization layers 118 (also referred to as redistribution layers or redistribution lines) in the dielectric layers 116, a dielectric layer 120, and bond pads 122 in the dielectric layer 120.

The backside interconnect structure 121 may include a plurality of the metallization layers 118 separated from each other by respective layers of the dielectric layers 116. The metallization layers 118 and the bond pads 122 of the backside interconnect structure 121 are electrically coupled to the conductive vias 114, and respective ones of the metallization layers 118 may be physically coupled to the conductive vias 114.

In some embodiments, the dielectric layers 116 are formed of a polymer, which may be a photo-sensitive material such as PBO, polyimide, a BCB-based polymer, or the like, and may be patterned using a lithography mask. In some embodiments, the dielectric layers 116 are formed of a nitride such as silicon nitride; an oxide such as silicon oxide, PSG, BSG, BPSG; or the like. The dielectric layers 116 may be formed by spin coating, lamination, CVD, the like, or a combination thereof. After each dielectric layer 116 is formed, it may be patterned to expose underlying conductive features, such as portions of underlying conductive vias 114 or the underlying metallization layers 118. The patterning may be by any acceptable process. In embodiments in which the dielectric layers 116 include a photo-sensitive material, the patterning may include exposing the dielectric layers 116 to light. The dielectric layers 116 may be developed after the exposure. In some embodiments, patterning the dielectric layers 116 may include etching using an anisotropic etch.

The metallization layers 118 each include conductive vias and/or conductive lines. The conductive vias extend through a respective dielectric layer 116, and the conductive lines extend along the respective dielectric layer 116, such as on a top surface of the respective dielectric layer 116. As an example to form a metallization layer 118, a seed layer (not separately illustrated) is formed over the respective underlying features. For example, the seed layer can be formed on a respective dielectric layer 116, in openings extending through the respective dielectric layer 116, and on an underlying feature such as the conductive vias 114 or the metallization layers 118. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using a deposition process, such as PVD, CVD, or the like. A photoresist is formed and patterned on the seed layer. The photoresist may be formed by spin coating or the like and may be exposed to light for patterning. The pattern of the photoresist corresponds to the metallization layer 118. The patterning forms openings through the photoresist to expose the seed layer. A conductive material is formed in the openings of the photoresist and on the exposed portions of the seed layer. The conductive material may be formed by plating, such as electroless plating or electroplating from the seed layer, or the like. The conductive material may comprise a metal or a metal alloy, such as copper, titanium, tungsten, aluminum, the like, or combinations thereof. The photoresist and portions of the seed layer on which the conductive material is not formed are removed. The photoresist may be removed by any acceptable ashing or stripping process, such as using an oxygen plasma or the like. Once the photoresist is removed, exposed portions of the seed layer are removed using an acceptable etching process, such as wet or dry etching. The remaining portions of the seed layer and conductive material form the metallization layer 118.

The dielectric layers 116 and the metallization layers 118 of the backside interconnect structure 121 are illustrated as an example. More or fewer dielectric layers 116 and metallization layers 118 than illustrated may be formed in the backside interconnect structure 121 by repeating or omitting the steps previously described.

The dielectric layer 120 is formed over the dielectric layers 116 and the metallization layers 118. The dielectric layer 120 may be formed of a material suitable for achieving dielectric-to-dielectric bonds. In some embodiments, the dielectric layer 120 may comprise silicon oxide, silicon nitride, silicon oxynitride, or the like. The dielectric layer 120 may be deposited using a suitable deposition process such as PVD, CVD, ALD, or the like.

The bond pads 122 are formed in the dielectric layer 120. The bond pads 122 are formed for external connection to the backside interconnect structure 121. The bond pads 122 may be formed on and extending along top surfaces of the dielectric layers 116. The bond pads 122 may be physically and electrically coupled to the metallization layers 118. The bond pads 122 may be electrically coupled to the conductive vias 114 through the metallization layers 118. The bond pads 122 may be formed of a material and by processes the same as or similar to the metallization layers 118. In some embodiments, the bond pads 122 have different sizes (e.g., different thicknesses) from the metallization layers 118. A planarization step may be performed to level surfaces of the bond pads 122 and surfaces of the dielectric layer 120.

Figure 5:
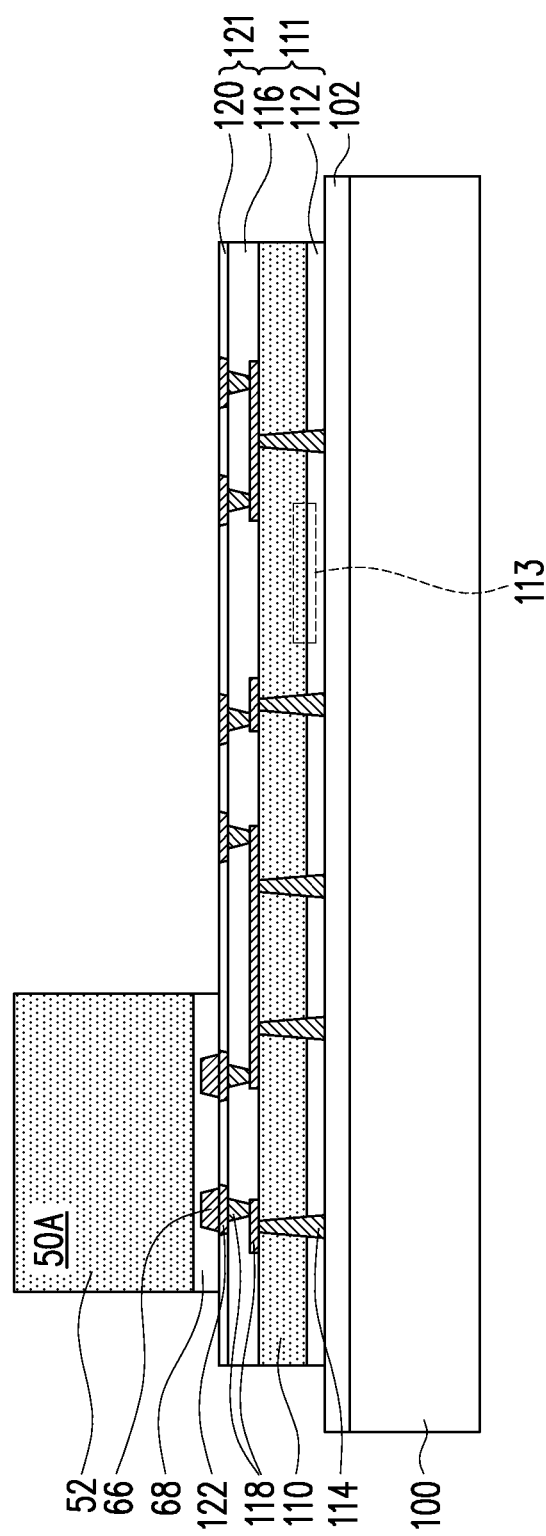

In FIG. 5, a first integrated circuit die 50A is bonded to the backside interconnect structure 121 by hybrid bonding. A desired type and quantity of integrated circuit dies 50 may be bonded to the backside interconnect structure 121 by hybrid bonding. In the illustrated embodiment, a single first integrated circuit die 50A is bonded to the backside interconnect structure 121. The first integrated circuit die 50A may be a logic device, such as a CPU, a GPU, an SoC, a microcontroller, or the like.

The first integrated circuit die 50A is bonded to the backside interconnect structure 121 in a hybrid bonding configuration. The first integrated circuit die 50A are disposed face down such that the front-side of the first integrated circuit die 50A faces the backside interconnect structure 121 and the backside of the first integrated circuit die 50A faces away from the backside interconnect structure 121. This may be referred to as a face-to-back configuration (F2B) as the face of the first integrated circuit die 50A is toward the back of the interface die 111.

The dielectric layer 68 of the first integrated circuit die 50A may be directly bonded to the dielectric layer 120, and the die connectors 66 of the first integrated circuit die 50A may be directly bonded to the bond pads 122. In some embodiments, the bonds between the dielectric layer 68 and the dielectric layer 120 are oxide-to-oxide bonds, or the like. The hybrid bonding process further directly bonds the die connectors 66 of the first integrated circuit die 50A to the bond pads 122 through direct metal-to-metal bonding. Thus, the first integrated circuit die 50A is electrically coupled to the backside interconnect structure 121 on the interface die 111 by the physical and electrical connection of the die connectors 66 and the bond pads 122. In some embodiments, the interface also includes dielectric-to-metal interfaces between the first integrated circuit die 50A and the backside interconnect structure 121 (e.g., when the die connectors 66 and the bond pads 122 are not perfectly aligned and/or have different widths).

As an example, the hybrid bonding process starts with applying a surface treatment to the dielectric layer 68 and/or the dielectric layer 120. The surface treatment may include a plasma treatment. The plasma treatment may be performed in a vacuum environment. After the plasma treatment, the surface treatment may further include a cleaning process (e.g., a rinse with deionized water or the like) that may be applied to the dielectric layer 68 and/or the dielectric layer 120. The die connectors of the first integrated circuit die 50A may be aligned with the bond pads 122 of the backside interconnect structure 121. The die connectors 66 may overlap with the corresponding bond pads 122. A pre-bonding step is performed by placing the first integrated circuit die 50A in contact with the dielectric layer 120 and the respective bond pads 122 of the backside interconnect structure 121. The pre-bonding may be performed at room temperature (e.g., between about 21° C. and about 25° C.). After the pre-bonding, an anneal is performed at a temperature between about 150° C. and about 400° C. for a duration between about 0.5 hours and about 3 hours. This causes metal of the die connectors 66 (e.g., copper) and metal of the bond pads 122 (e.g., copper) to inter-diffuse forming direct metal-to-metal bonds.

The first integrated circuit die 50A is bonded to the backside interconnect structure 121 without the use of solder connections (e.g., micro-bumps or the like). By directly bonding the first integrated circuit die 50A to the backside interconnect structure 121, advantages can be achieved, such as, finer bump pitch; small form factor packages by using hybrid bonds; smaller bonding pitch scalability for chip I/O to realize high density die-to-die interconnects; improved mechanical endurance; improved electrical performance; reduced defects; and increased yield. Further, shorter die-to-die distances may be achieved between the first integrated circuit die 50A and other integrated circuit dies, which has the benefits of smaller form-factor, higher bandwidth, improved power integrity (PI), improved signal integrity (SI), and lower power consumption.

Figure 6:
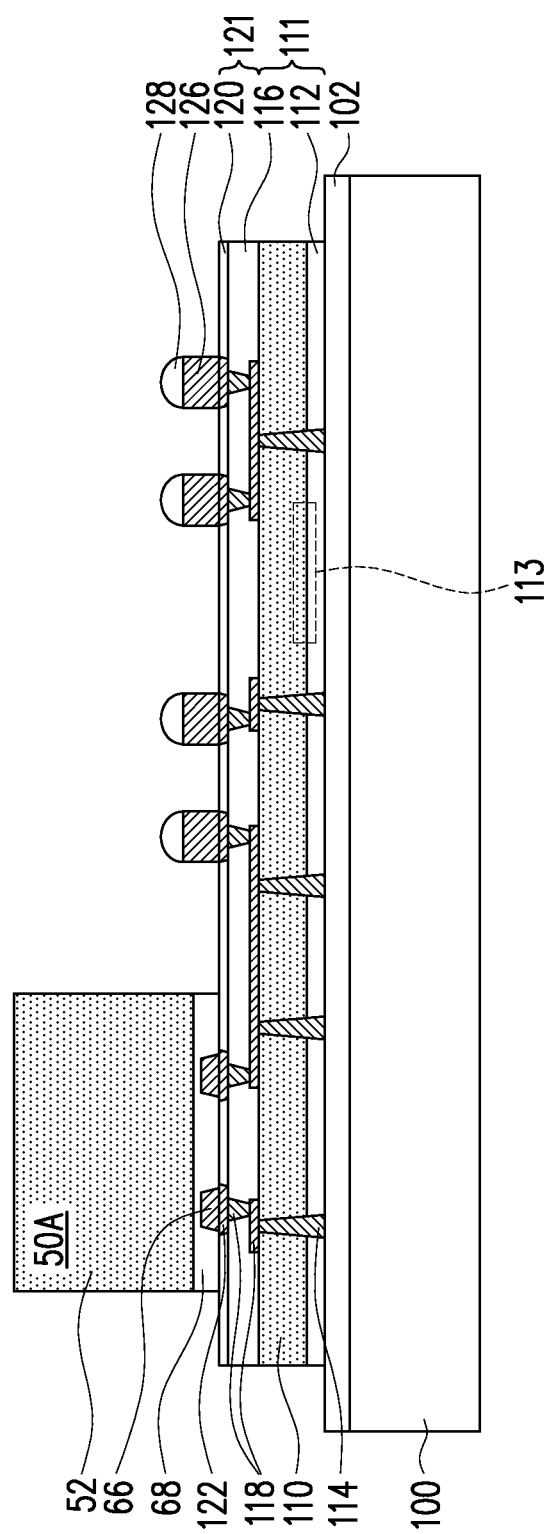

In FIG. 6, bond pads 126 are formed on the bond pads 122 and the dielectric layer 120 of the backside interconnect structure 121 and conductive connectors 128 are formed on the bond pads 126. The bond pads 126 may be formed by forming a seed layer (not separately illustrated) over the bond pads 122 and the dielectric layer 120. In some embodiments, the seed layer is a metal layer, which may be a single layer or a composite layer including a plurality of sub-layers formed of different materials. In some embodiments, the seed layer includes a titanium layer and a copper layer over the titanium layer. The seed layer may be formed using PVD or the like. A photoresist is formed and patterned on the seed layer. The photoresist may be formed by spin coating or the like and may be exposed to light for patterning. The pattern of the photoresist corresponds to the bond pads 126. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may include a metal, such as copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed using an acceptable etching process. The remaining portions of the seed layer and the conductive material form the bond pads 126.

The conductive connectors 128 are formed on the bond pads 126. The conductive connectors 128 may be ball grid array (BGA) connectors, solder balls, controlled collapse chip connection (C4) bumps, micro bumps, electroless nickel-electroless palladium-immersion gold technique (ENEPIG) formed bumps, or the like. The conductive connectors 128 may be formed of a conductive material that is reflowable, such as solder, copper, aluminum, gold, nickel, silver, palladium, tin, the like, or a combination thereof. In some embodiments, the conductive connectors 128 are formed by initially forming a layer of solder through evaporation, electroplating, printing, solder transfer, ball placement, or the like. Once the layer of solder has been formed on the structure, a reflow may be performed in order to shape the material into desired bump shapes. In some embodiments, the bond pads 126 may be omitted and the conductive connectors 128 may be formed on the bond pads 122.

Figure 7:
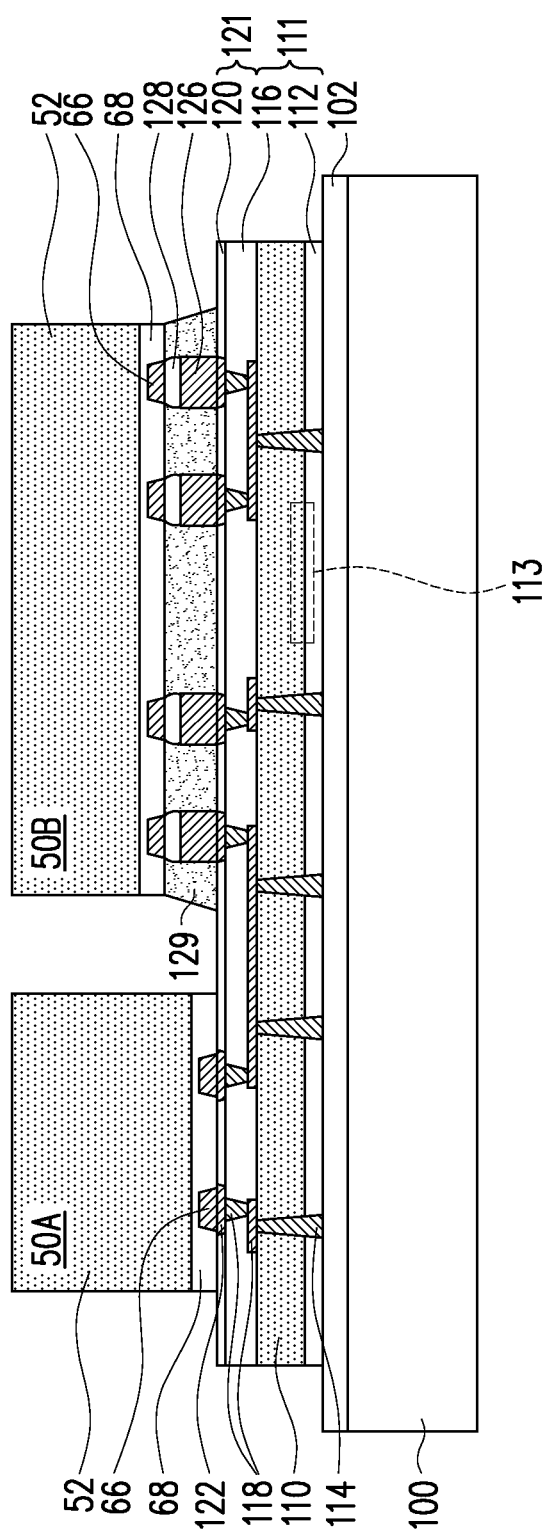

In FIG. 7, a second integrated circuit die 50B is bonded to the backside interconnect structure 121 on the interface die 111 by solder bonding. A desired type and quantity of integrated circuit dies 50 may be bonded to the backside interconnect structure 121 by solder bonding. In the illustrated embodiment, a single second integrated circuit die 50B is bonded to the backside interconnect structure 121. The second integrated circuit die 50B may be a memory device, such as a DRAM die, an SRAM die, a NAND flash die, an HMC module, an HBM module, or the like. Although the second integrated circuit die 50B is illustrated as a single integrated circuit die, the second integrated circuit die 50B may include a plurality of stacked integrated circuit dies (also referred to as a die stack).

The second integrated circuit die 50B is attached to the interface die 111 with solder bonds, such as with the conductive connectors 128. The second integrated circuit die 50B may be placed on the backside interconnect structure 121 using, e.g., a pick-and-place tool. Attaching the second integrated circuit die 50B to the interface die 111 may include placing the second integrated circuit die 50B on the interface die 111 and reflowing the conductive connectors 128. The conductive connectors 128 form joints between the bond pads 126 on the interface die 111 and the die connectors 66 of the second integrated circuit die 50B, electrically coupling the interface die 111 to the second integrated circuit die 50B through the backside interconnect structure 121.

An underfill material 129 may be formed around the conductive connectors 128, and between the second integrated circuit die 50B and the backside interconnect structure 121. The underfill material 129 may reduce stress and protect the joints resulting from the reflowing of the conductive connectors 128. The underfill material 129 may be formed of any suitable underfill material, such as a molding compound, an epoxy, or the like. The underfill material 129 may be formed by a capillary flow process after the second integrated circuit die 50B is attached to the backside interconnect structure 121, or may be formed by a suitable deposition method before the second integrated circuit die 50B is attached to the backside interconnect structure 121. The underfill material 129 may be applied in a liquid or a semi-liquid form and subsequently cured. In some embodiments, the underfill material 129 is omitted, and the underfill material 129 is omitted in subsequent figures.

The first integrated circuit die 50A and the second integrated circuit die 50B may be formed by processes of a same technology node, or may be formed by processes of different technology nodes. For example, the first integrated circuit die 50A may be of a more advanced process node than the second integrated circuit die 50B. The first integrated circuit die 50A and the second integrated circuit die 50B may have different sizes (e.g., different heights and/or surface areas), or may have the same size (e.g., the same heights and/or surface areas). Other combinations of the integrated circuit dies 50 are possible. In some embodiments, the first integrated circuit die 50A and the second integrated circuit die 50B may have thicknesses greater than about 100 µm.

The first integrated circuit die 50A and the second integrated circuit die 50B may be electrically coupled to one another through the interface die 111. The first integrated circuit die 50A is physically electrically coupled to the backside interconnect structure 121 through hybrid bonds between the die connectors 66 and the bond pads 122, and the second integrated circuit die 50B is physically and electrically coupled to the backside interconnect structure 121 through solder bonds between the die connectors 66 and the bond pads 126. In some embodiments, the first integrated circuit die 50A may be a logic die and the second integrated circuit die 50B may be a memory die. The first integrated circuit die 50A has a relatively smaller pitch of the die connectors 66 and a higher circuit density, while the second integrated circuit die 50B has a relatively larger pitch of the die connectors 66 and a lower circuit density. Bonding the first integrated circuit die 50A to the backside interconnect structure 121 by hybrid bonding achieves advantages, such as finer bump pitch, higher bandwidth, and improved device performance. Bonding the second integrated circuit die 50B to the backside interconnect structure 121 by solder bonding reduces costs.

Figure 8:
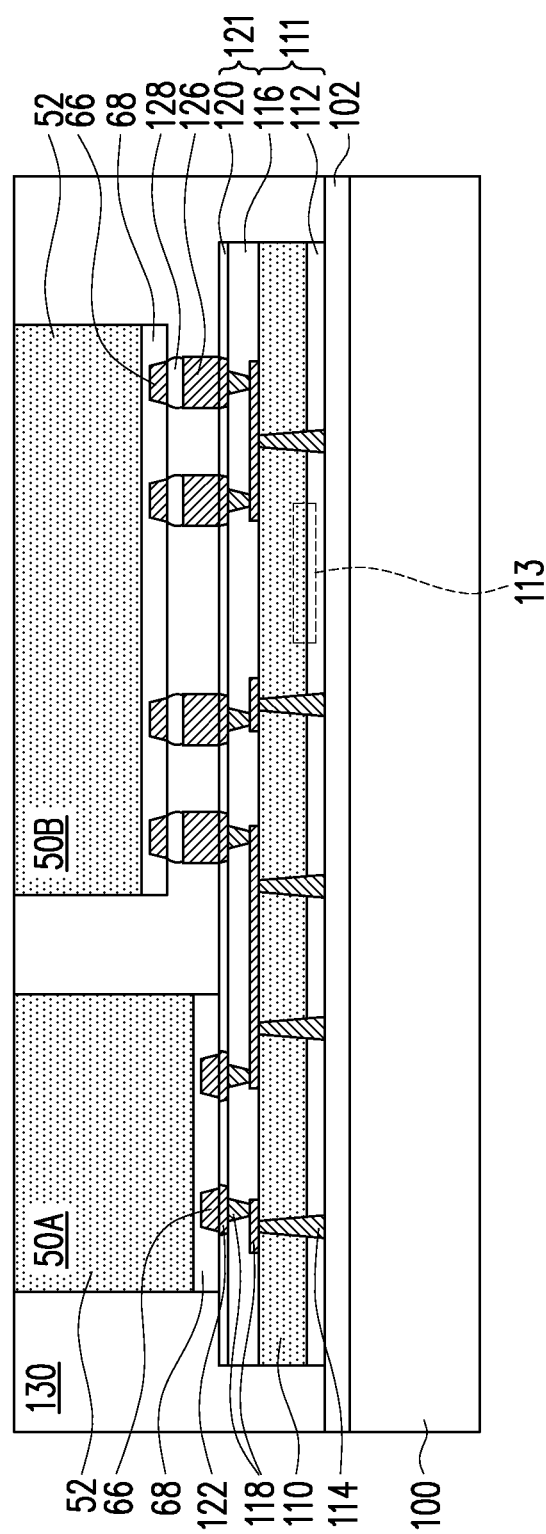

In FIG. 8, an encapsulant 130 is formed on the backside interconnect structure 121 and around the first integrated circuit die 50A, the second integrated circuit die 50B, the conductive connectors 128, the bond pads 126, and the interface die 111. After formation, the encapsulant 130 encapsulates the first integrated circuit die 50A, the second integrated circuit die 50B, the conductive connectors 128, the bond pads 126, the underfill material (if present), and the interface die 111. The encapsulant 130 may be a molding compound, epoxy, or the like. The encapsulant 130 may be applied by compression molding, transfer molding, or the like. The encapsulant 130 is formed over the interface die 111 such that the first integrated circuit die 50A, the second integrated circuit die 50B, and the interface die 111 are buried or covered. The encapsulant 130 is formed in gap regions between the first integrated circuit die 50A and the second integrated circuit die 50B. In embodiments in which the underfill material is omitted, the encapsulant 130 may be formed around the conductive connectors 128, and between the second integrated circuit die 50B and the backside interconnect structure 121. The encapsulant 130 may be applied in a liquid or a semi-liquid form and subsequently cured.

The encapsulant 130 is then thinned to expose backsides of the first integrated circuit die 50A and the second integrated circuit die 50B. The thinning process may be a grinding process, a CMP, an etch-back, combinations thereof, or the like. After the thinning process, the top surfaces of the first integrated circuit die 50A, the second integrated circuit die 50B, and the encapsulant 130 are coplanar (within process variations). The thinning is performed until a desired amount of the first integrated circuit die 50A, the second integrated circuit die 50B, and the encapsulant 130 has been removed. Specifically, the thinning removes the portions of the encapsulant 130 covering the top surface of the first integrated circuit die 50A and the second integrated circuit die 50B until no encapsulant 130 remains over the first integrated circuit die 50A and the second integrated circuit die 50B.

Figure 9:
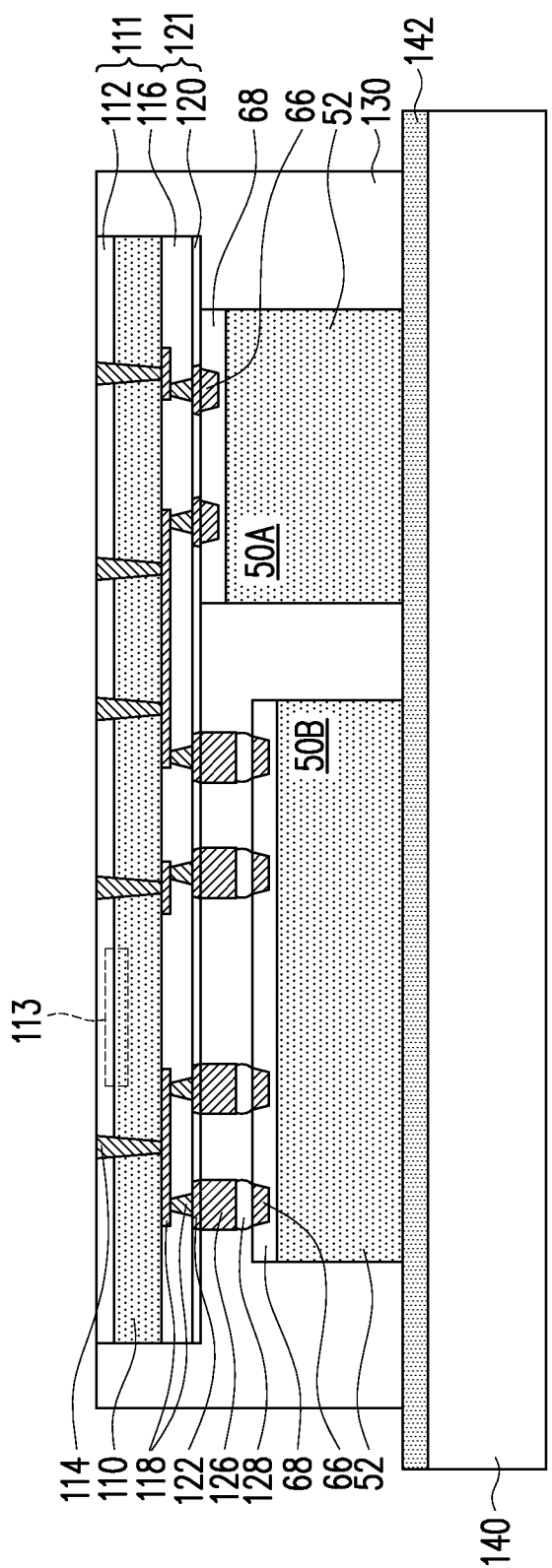

In FIG. 9, the structure of FIG. 8 is flipped; the encapsulant 130, the first integrated circuit die 50A, and the second integrated circuit die 50B are attached to a carrier substrate 140; and the carrier substrate 100 and the release layer 102 are removed. The device may be flipped such that backsides of the first integrated circuit die 50A and the second integrated circuit die 50B face downwards. The carrier substrate 140 may be bonded to the encapsulant 130, the first integrated circuit die 50A, and the second integrated circuit die 50B through a release layer 142. The carrier substrate 140 may be a glass carrier substrate, a ceramic carrier substrate, or the like. The carrier substrate 140 may be a wafer, such that multiple packages can be processed on the carrier substrate 140 simultaneously. The release layer 142 may be formed of a polymer-based material, which may be removed along with the carrier substrate 140 from the overlying structures that will be formed in subsequent steps. In some embodiments, the release layer 142 is an epoxy-based thermal-release material, which loses its adhesive property when heated, such as an LTHC release coating. In some embodiments, the release layer 142 may be a UV glue, which loses its adhesive property when exposed to UV radiation, such radiation from UV lights. The release layer 142 may be dispensed as a liquid and cured, may be a laminate film laminated onto the release layer 142, or may be the like. The top surface of the release layer 142 may be leveled and may have a high degree of planarity.

A carrier substrate de-bonding is performed to detach (or "de-bond") the carrier substrate 100 from the interface die 111 and the encapsulant 130. In some embodiments, the de-bonding includes projecting a light, such as a laser light or an UV light, on the release layer 102 so that the release layer 102 decomposes under the heat of the light and the carrier substrate 100 can be removed. As illustrated in FIG. 9, surfaces of the encapsulant 130, the conductive vias 114, and the dielectric layer 112 may be exposed after removing the carrier substrate 100 and the release layer 102.

Figure 10:
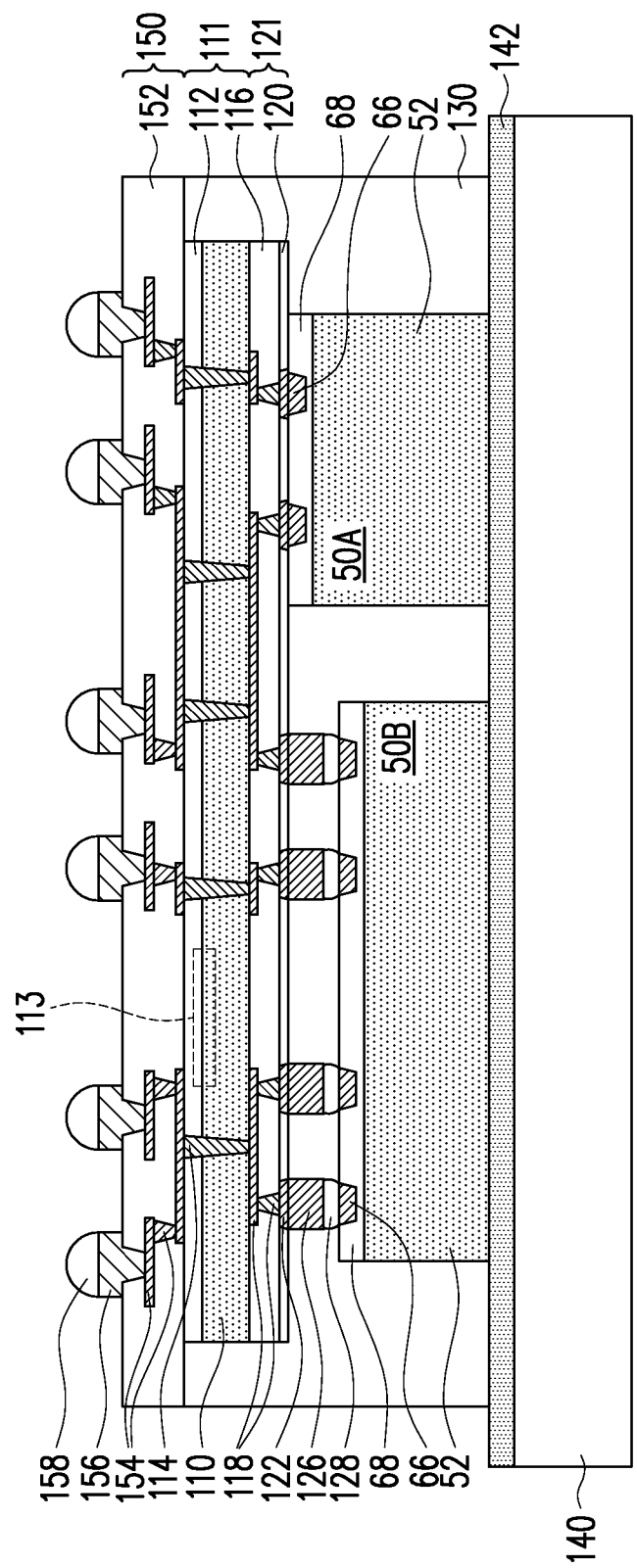

In FIG. 10, a front-side interconnect structure 150 is formed on the interface die 111 and the encapsulant 130 opposite the carrier substrate 140. The front-side interconnect structure 150 includes dielectric layers 152 and metallization layers 154 (sometimes referred to as redistribution layers or redistribution lines) in the dielectric layers 152. For example, the front-side interconnect structure 150 may include a plurality of metallization layers 154 separated from each other by respective dielectric layers 152. The metallization layers 154 of the front-side interconnect structure 150 are electrically coupled to the conductive vias 114 of the interface die 111. The metallization layers 154 are electrically coupled to the first integrated circuit die 50A and the second integrated circuit die 50B through the conductive vias 114 and the backside interconnect structure 121. The first integrated circuit die 50A and the second integrated circuit die 50B may be electrically coupled to one another through the metallization layers 118 of the backside interconnect structure 121 and/or the metallization layers 154 of the front-side interconnect structure 150.

In some embodiments, the dielectric layers 152 are formed of a polymer, which may be a photo-sensitive material such as PBO, polyimide, a BCB-based polymer, or the like, and may be patterned using a lithography mask. In some embodiments, the dielectric layers 152 are formed of a nitride such as silicon nitride; an oxide such as silicon oxide, PSG, BSG, BPSG; or the like. The dielectric layers 152 may be formed by spin coating, lamination, CVD, the like, or a combination thereof. After each dielectric layer 152 is formed, it may be patterned to expose underlying conductive features, such as portions of underlying conductive vias 114 or the underlying metallization layers 154. The patterning may be by any acceptable process. In embodiments in which the dielectric layers 152 include a photo-sensitive material, the patterning may include exposing the dielectric layers 152 to light. The dielectric layers 152 may be developed after the exposure. In some embodiments, patterning the dielectric layers 152 may include etching using an anisotropic etch.

The metallization layers 154 each include conductive vias and/or conductive lines. The conductive vias extend through a respective dielectric layer 152, and the conductive lines extend along the respective dielectric layer 152, such as on a top surface of the respective dielectric layer 152. As an example to form a metallization layer 154, a seed layer (not separately illustrated) is formed over the respective underlying features. For example, the seed layer can be formed on a respective dielectric layer 152, in openings extending through the respective dielectric layer 152, and on an underlying feature such as the conductive vias 114 or the metallization layers 154. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using a deposition process, such as PVD, CVD, or the like. A photoresist is formed and patterned on the seed layer. The photoresist may be formed by spin coating or the like and may be exposed to light for patterning. The pattern of the photoresist corresponds to the metallization layer 154. The patterning forms openings through the photoresist to expose the seed layer. A conductive material is formed in the openings of the photoresist and on the exposed portions of the seed layer. The conductive material may be formed by plating, such as electroless plating or electroplating from the seed layer, or the like. The conductive material may comprise a metal or a metal alloy, such as copper, titanium, tungsten, aluminum, the like, or combinations thereof. The photoresist and portions of the seed layer on which the conductive material is not formed are removed. The photoresist may be removed by any acceptable ashing or stripping process, such as using an oxygen plasma or the like. Once the photoresist is removed, exposed portions of the seed layer are removed using an acceptable etching process, such as wet or dry etching. The remaining portions of the seed layer and conductive material form the metallization layer 154.

The dielectric layers 152 and the metallization layers 154 of the front-side interconnect structure 150 are illustrated as an example. More or fewer dielectric layers 152 and metallization layers 154 than illustrated may be formed in the front-side interconnect structure 150 by repeating or omitting the steps previously described.

Under-bump metallizations (UBMs) 156 are formed for external connection to the front-side interconnect structure 150. The UBMs 156 include bump portions on and extending along a top surface of an uppermost dielectric layer of the dielectric layers 152 of the front-side interconnect structure 150, and include via portions extending through the uppermost dielectric layer of the dielectric layers 152 of the front-side interconnect structure 150. The via portions may be physically and electrically coupled to an uppermost metallization layer of the metallization layers 154 of the front-side interconnect structure 150. The UBMs 156 may be electrically coupled to the conductive vias 114, the first integrated circuit die 50A, and the second integrated circuit die 50B. The UBMs 156 may be formed of materials and processes the same as or similar to those used to form the metallization layers 154. In some embodiments, the UBMs 156 have different sizes (such as greater sizes) than the metallization layers 154.

Conductive connectors 158 are formed on the UBMs 156. The conductive connectors 158 may be BGA connectors, solder balls, metal pillars, C4 bumps, micro bumps, ENEPIG-formed bumps, or the like. The conductive connectors 158 may include a conductive material such as solder, copper, aluminum, gold, nickel, silver, palladium, tin, the like, or a combination thereof. In some embodiments, the conductive connectors 158 are formed by initially forming a layer of solder through evaporation, electroplating, printing, solder transfer, ball placement, or the like. Once a layer of solder has been formed on the structure, a reflow may be performed in order to shape the material into the desired bump shapes. In some embodiments, the conductive connectors 158 comprise metal pillars (such as copper pillars) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 11:
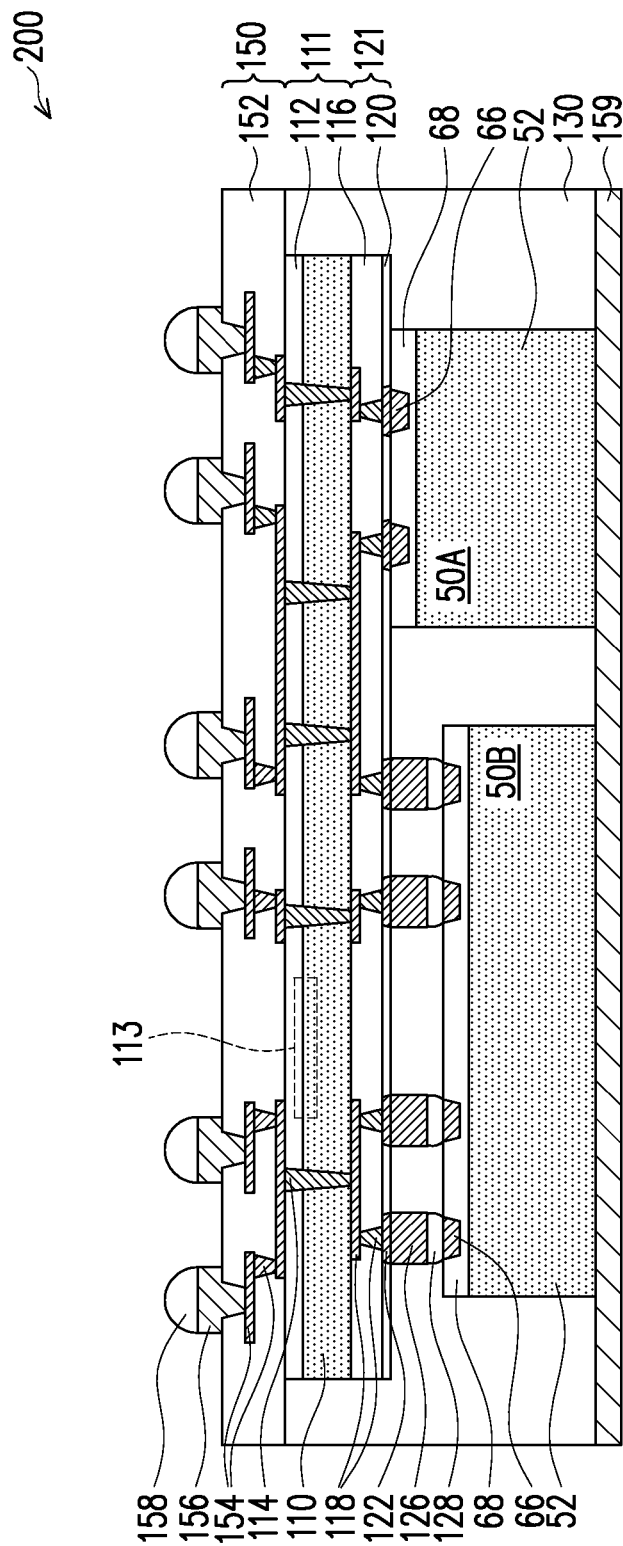

In FIG. 11, the carrier substrate 140 is removed and a heat dissipation layer 159 is optionally formed over the encapsulant 130, the first integrated circuit die 50A, and the second integrated circuit die 50B. The heat dissipation layer 159, the encapsulant 130, the first integrated circuit die 50A, the second integrated circuit die 50B, and the interface die 111 form a first packaged component 200. A carrier substrate de-bonding is performed to detach the carrier substrate 140 from the encapsulant 130, the first integrated circuit die 50A, and the second integrated circuit die 50B. In some embodiments, the de-bonding includes projecting a light, such as a laser light or an UV light, on the release layer 142 so that the release layer 142 decomposes under the heat of the light and the carrier substrate 140 can be removed. As illustrated in FIG. 11, surfaces of the encapsulant 130, the first integrated circuit die 50A, and the second integrated circuit die 50B may be exposed after removing the carrier substrate 140 and the release layer 142.

The heat dissipation layer 159 is formed over the encapsulant 130, the first integrated circuit die 50A, and the second integrated circuit die 50B. The heat dissipation layer 159 is formed a material with high thermal conductivity, such as a metal or metal nitride. In some embodiments, the heat dissipation layer 159 may be formed of aluminum, titanium, titanium nitride, nickel, nickel vanadium, silver, gold, copper, combinations thereof, or the like. The heat dissipation layer 159 may be conformally formed by a PVD process, such as sputtering or evaporation; a plating process, such as electroless plating or electroplating; a printing process, such as inkjet printing; or the like. In some embodiments, the heat dissipation layer 159 is formed of copper by a sputtering process. The heat dissipation layer 159 may be included to increase heat dissipation from the first integrated circuit die 50A and the second integrated circuit die 50B. In some embodiments, the heat dissipation layer 159 may be formed over the encapsulant 130, the first integrated circuit die 50A, and the second integrated circuit die 50B before attaching the encapsulant 130, the first integrated circuit die 50A, and the second integrated circuit die 50B to the carrier substrate 140. In some embodiments, the heat dissipation layer 159 may be omitted.

Including both the first integrated circuit die 50A and the second integrated circuit die 50B bonded to an interface of the backside interconnect structure 121 by hybrid bonding and solder bonding, respectively, allows for benefits from both hybrid bonding and solder bonding to be achieved. For example, hybrid bonding the first integrated circuit die 50A allows for dies with small pitches to be bonded to the backside interconnect structure 121, provides higher bandwidth, and provides improved device performance. Solder bonding the second integrated circuit die 50B reduces costs, while still providing sufficiently small bond pitches.

FIGS. 2 through 11 illustrate an embodiment in which the package has a face-to-back structure, in which integrated circuit dies 50 have their front surfaces facing the back surface of the interface die 111. FIGS. 12 through 15 illustrate an embodiment in which a package has a face-to-face structure, in which integrated circuit dies 50 have their front surfaces facing the front surface of the interface die 111. FIGS. 12 through 15 illustrate cross-sectional views of intermediate steps during a process for forming a second packaged component 300 (illustrated in FIG. 15), in accordance with some embodiments.

Figure 12:
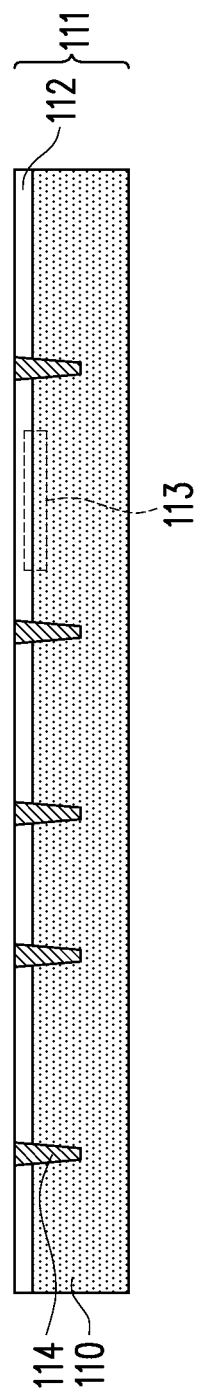

In FIG. 12, an interface die 111 is provided. The interface die 111 may be the same as or similar to the interface die 111, discussed above with respect to FIG. 2. As illustrated in FIG. 12, the interface die 111 may include an interface substrate 110, a dielectric layer 112 on a front-side of the interface substrate 110, active devices 113 formed in and/or on the front-side of the interface substrate 110, and conductive vias 114 extending through the dielectric layer 112 and into the interface substrate 110.

Figure 13:
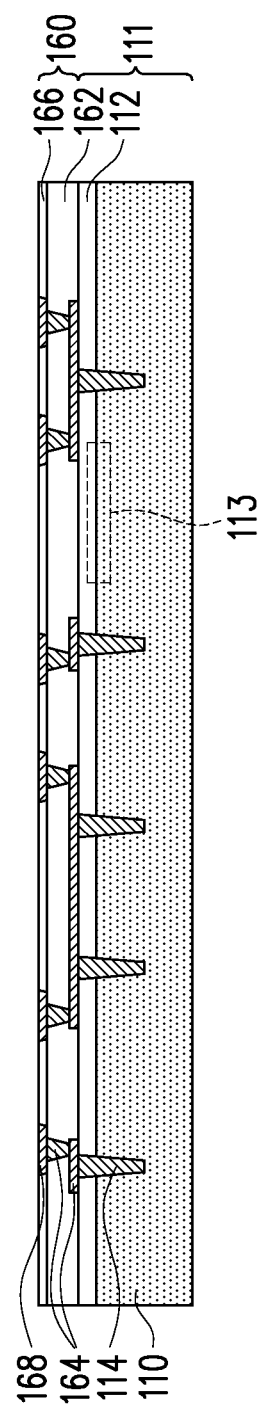

In FIG. 13, a front-side interconnect structure 160 is formed over the interface die 111. The front-side interconnect structure 160 includes dielectric layers 162, metallization layers 164 in the dielectric layers 162, a dielectric layer 166, and bond pads 168 in the dielectric layer 166. The front-side interconnect structure 160 may be formed of materials and using processes the same as or similar to those of the backside interconnect structure 121, described above with respect to FIG. 4. Specifically, the dielectric layers 162, the metallization layers 164, the dielectric layer 166, and the bond pads 168 may be formed of materials and using processes the same as or similar to the dielectric layers 116, the metallization layers 118, the dielectric layer 120, and the bond pads 122, respectively.

Figure 14:
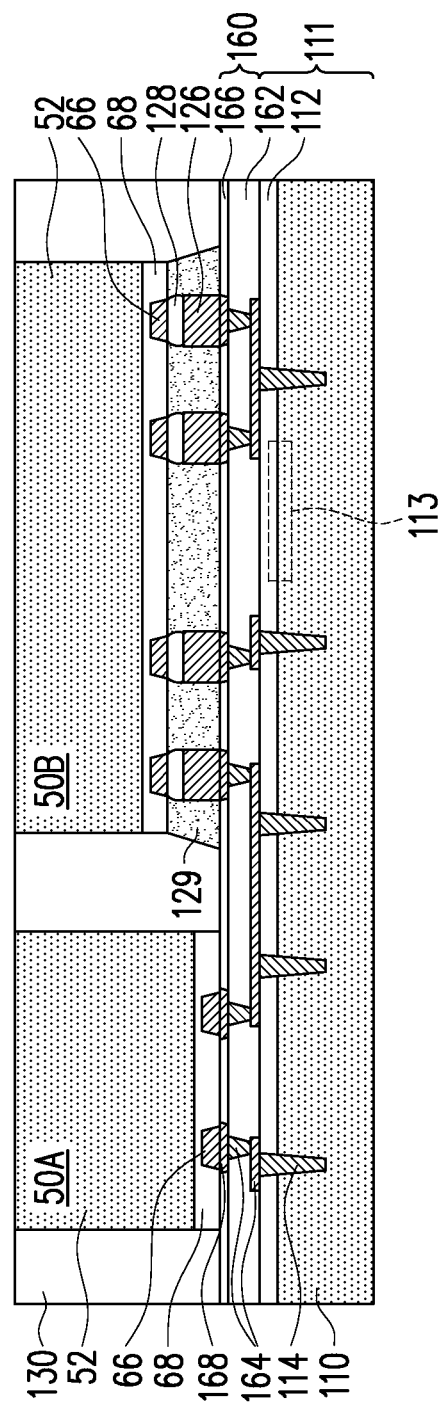

In FIG. 14, a first integrated circuit die 50A and a second integrated circuit die 50B are bonded to the front-side interconnect structure 160, an underfill material 129 is optionally formed between the second integrated circuit die 50B and the front-side interconnect structure 160, and an encapsulant 130 is formed around the first integrated circuit die 50A and the second integrated circuit die 50B. The first integrated circuit die 50A may be bonded to the front-side interconnect structure 160 by hybrid bonding, as described above with respect to FIG. 5. The second integrated circuit die 50B may be bonded to the front-side interconnect structure 160 by solder bonding through bond pads 126 and conductive connectors 128, as described above with respect to FIGS. 6 and 7. The underfill material 129 may be formed of materials and using processes the same as or similar to the underfill material 129, described above with respect to FIG. 7. The encapsulant 130 may be formed of materials and using processes the same as or similar to the encapsulant 130, described above with respect to FIG. 8. Hybrid bonding the first integrated circuit die 50A allows for dies with small pitches to be bonded to the front-side interconnect structure 160, provides higher bandwidth, and provides improved device performance. Solder bonding the second integrated circuit die 50B reduces costs, while still providing sufficiently small bond pitches.

Figure 15:
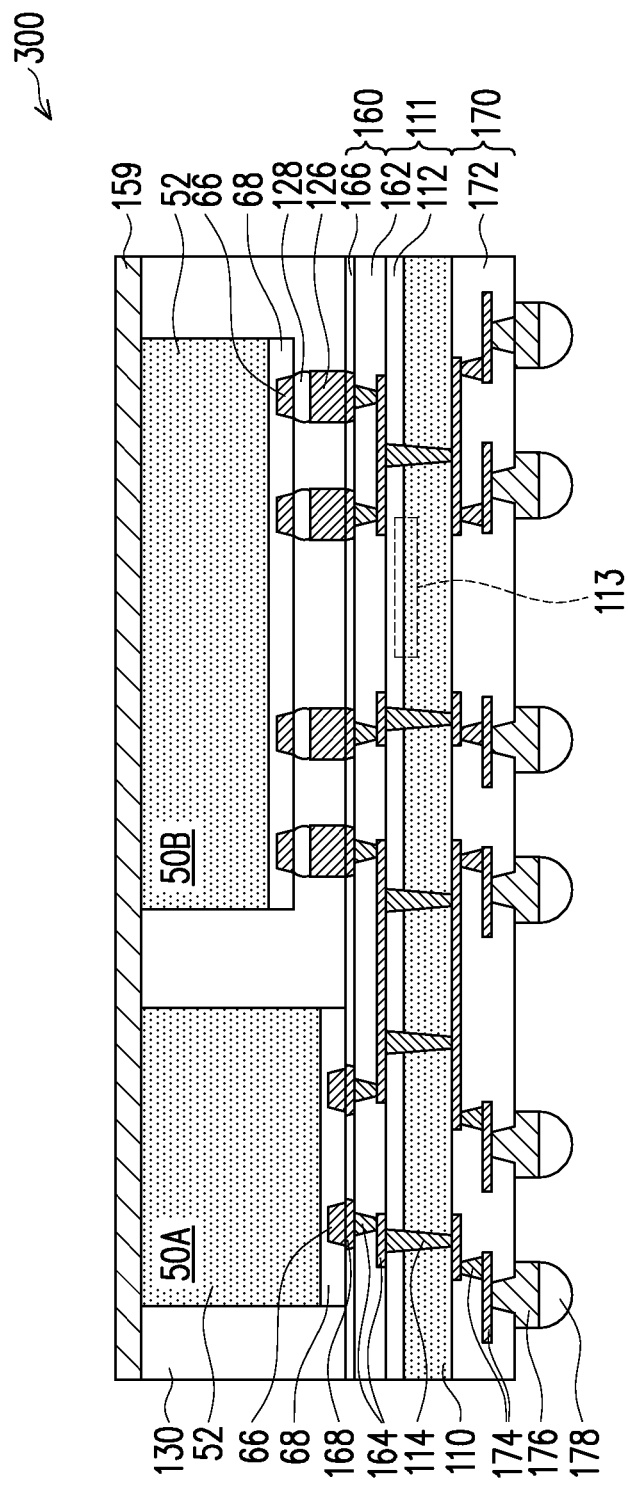

In FIG. 15, the backside of the interface substrate 110 is thinned, a backside interconnect structure 170 is formed on a backside of the interface substrate 110, and a heat dissipating layer 159 is optionally formed on the encapsulant 130, the first integrated circuit die 50A, and the second integrated circuit die 50B. The heat dissipation layer 159, the encapsulant 130, the first integrated circuit die 50A, the second integrated circuit die 50B, and the interface die 111 form a second packaged component 300. The interface substrate 110 may be thinned by a planarization process applied to the interface substrate 110 to expose the conductive vias 114. After the conductive vias 114 are exposed, the conductive vias 114 extend through the interface substrate 110 and may be referred to as TSVs. The planarization may remove portions of the interface substrate 110 opposite the dielectric layer 112 such that the conductive vias 114 are exposed. The planarization may be achieved by any suitable process, such as a CMP, a grinding process, an etch-back process, the like, or a combination thereof. After the planarization, the conductive vias 114 may extend completely through the interface substrate 110 and provide interconnection between opposite sides of the interface substrate 110.

The backside interconnect structure 170 may be formed of materials and using processes the same as or similar to those of the front-side interconnect structure 150, described above with respect to FIG. 10. The backside interconnect structure 170 includes dielectric layers 172 and metallization layers 174 in the dielectric layers 172. The dielectric layers 172 and the metallization layers 174 may be formed of materials and using processes the same as or similar to the dielectric layers 152 and the metallization layers 154, respectively.

UBMs 176 and conductive connectors 178 are formed for external connection to the backside interconnect structure 170. The UBMs 176 and the conductive connectors 178 may be formed of materials and using processes the same as or similar to the UBMs 156 and the conductive connectors 158, respectively, discussed above with respect to FIG. 10. The UBMs 176 include bump portions on and extending along a top surface of an uppermost dielectric layer of the dielectric layers 172 of the backside interconnect structure 170, and include via portions extending through the uppermost dielectric layer of the dielectric layers 172 of the backside interconnect structure 170. The via portions may be physically and electrically coupled to an uppermost metallization layer of the metallization layers 174 of the backside interconnect structure 170. The UBMs 176 may be electrically coupled to the conductive vias 114, the first integrated circuit die 50A, and the second integrated circuit die 50B.

The heat dissipation layer 159 is formed over the encapsulant 130, the first integrated circuit die 50A, and the second integrated circuit die 50B. The heat dissipation layer 159 is formed a material with high thermal conductivity, such as a metal or metal nitride. In some embodiments, the heat dissipation layer 159 may be formed of aluminum, titanium, titanium nitride, nickel, nickel vanadium, silver, gold, copper, combinations thereof, or the like. The heat dissipation layer 159 may be conformally formed by a PVD process, such as sputtering or evaporation; a plating process, such as electroless plating or electroplating; a printing process, such as inkjet printing; or the like. In some embodiments, the heat dissipation layer 159 is formed of copper by a sputtering process. The heat dissipation layer 159 may be included to increase heat dissipation from the first integrated circuit die 50A and the second integrated circuit die 50B. In some embodiments, the heat dissipation layer 159 may be formed over the encapsulant 130, the first integrated circuit die 50A, and the second integrated circuit die 50B before attaching the encapsulant 130, the first integrated circuit die 50A, and the second integrated circuit die 50B to the carrier substrate 140. In some embodiments, the heat dissipation layer 159 may be omitted.

Including both the first integrated circuit die 50A and the second integrated circuit die 50B bonded to an interface of the front-side interconnect structure 160 by hybrid bonding and solder bonding, respectively, allows for benefits from both hybrid bonding and solder bonding to be achieved. For example, hybrid bonding the first integrated circuit die 50A allows for dies with small pitches to be bonded to the front-side interconnect structure 160, provides higher bandwidth, and provides improved device performance. Solder bonding the second integrated circuit die 50B reduces costs, while still providing sufficiently small bond pitches.

Figure 17:
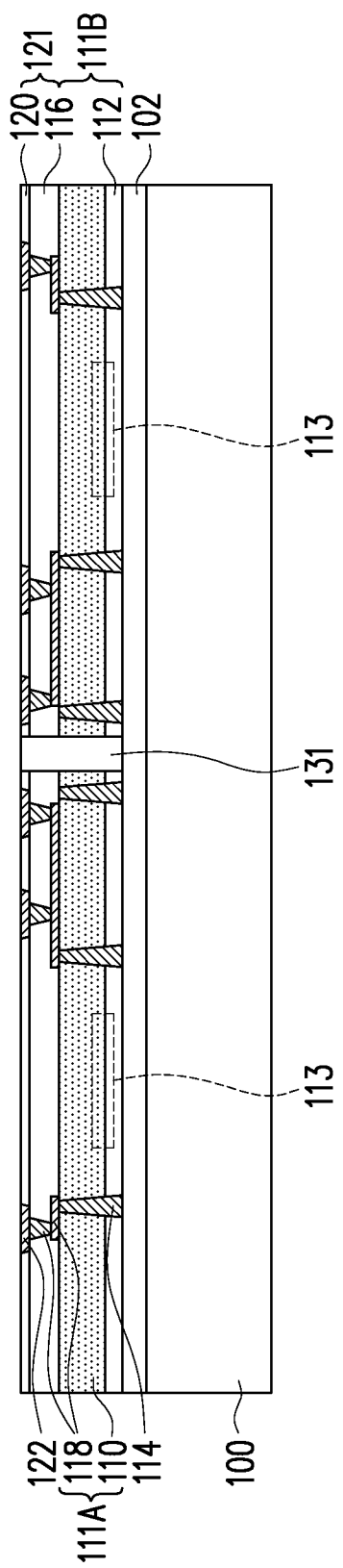
Figure 18:
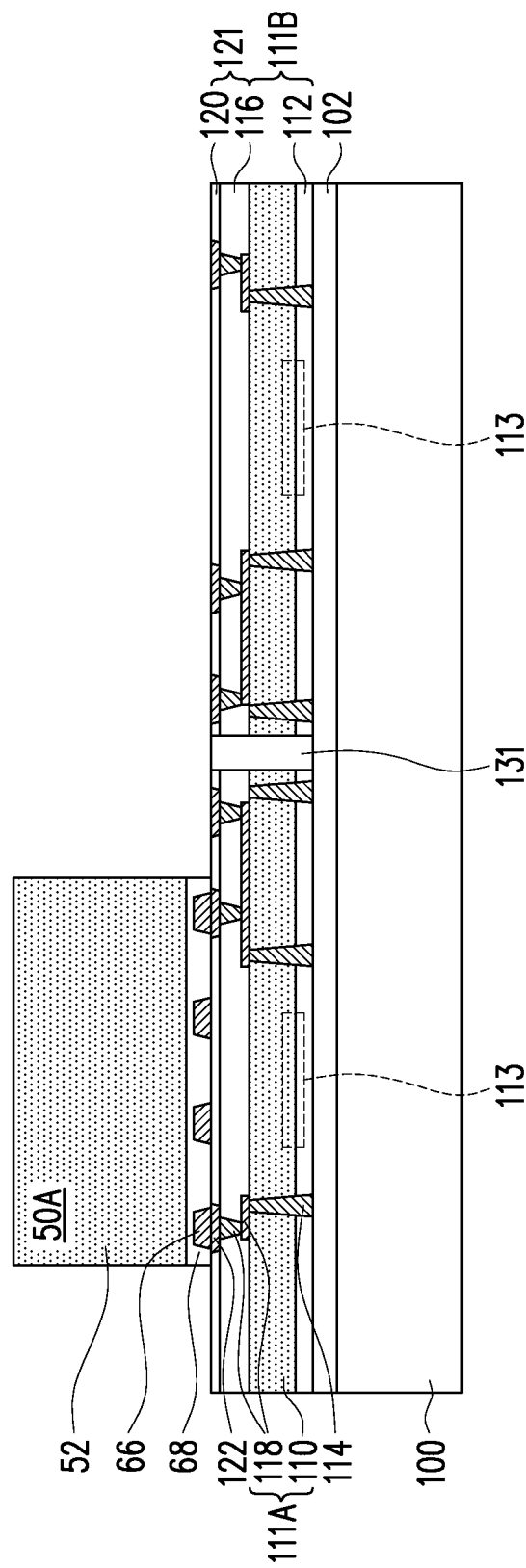
Figure 19:
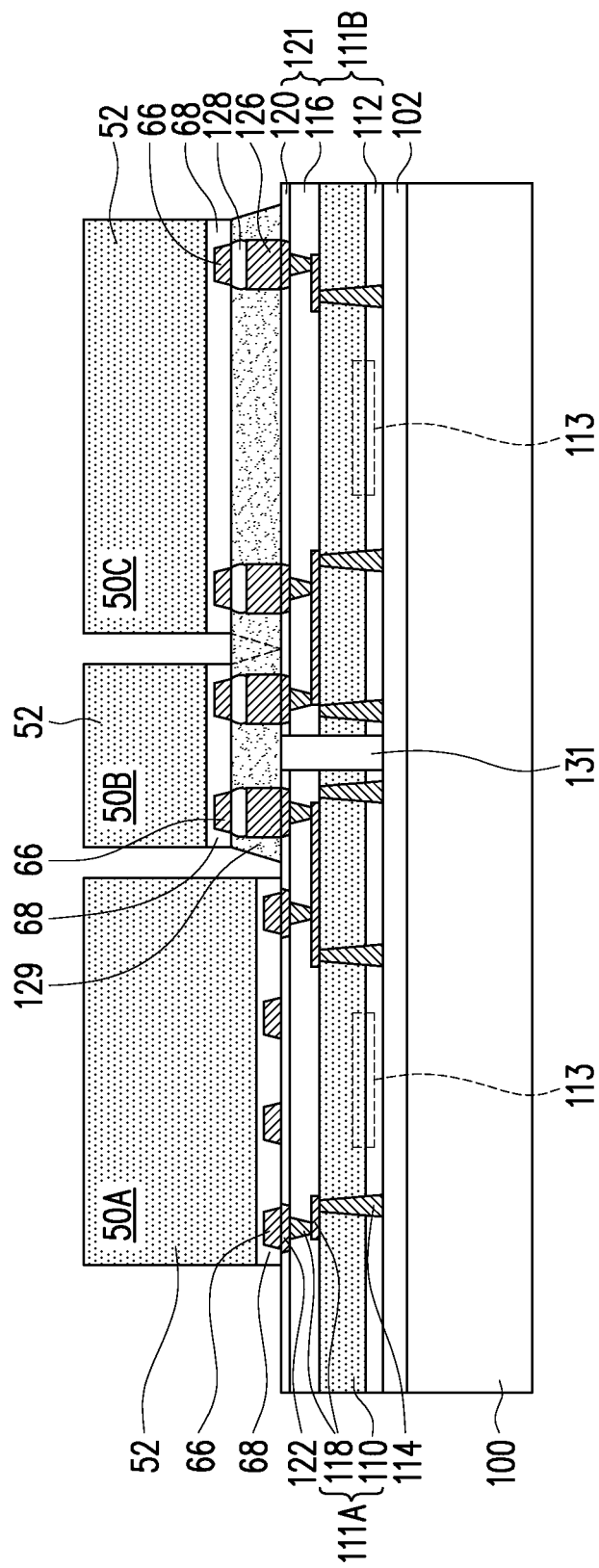

FIGS. 16 through 21 illustrate an embodiment in which three integrated circuit dies 50 are bonded to two interface dies 111. Specifically, as illustrated in FIG. 19, a first integrated circuit die 50A is hybrid bonded on a first interface die 111A, a second integrated circuit die 50B is solder bonded on the first interface die 111A and a second interface die 111B, and a third integrated circuit die 50C is solder bonded on the second interface die 111B. FIGS. 16 through 21 illustrate an embodiment in which a package has a face-to-back structure, in which the integrated circuit dies 50 have their front surfaces facing the back surfaces of the interface dies 111. FIGS. 16 through 21 illustrate cross-sectional views of intermediate steps during a process for forming a third packaged component 400 (illustrated in FIG. 21), in accordance with some embodiments.

Figure 16:
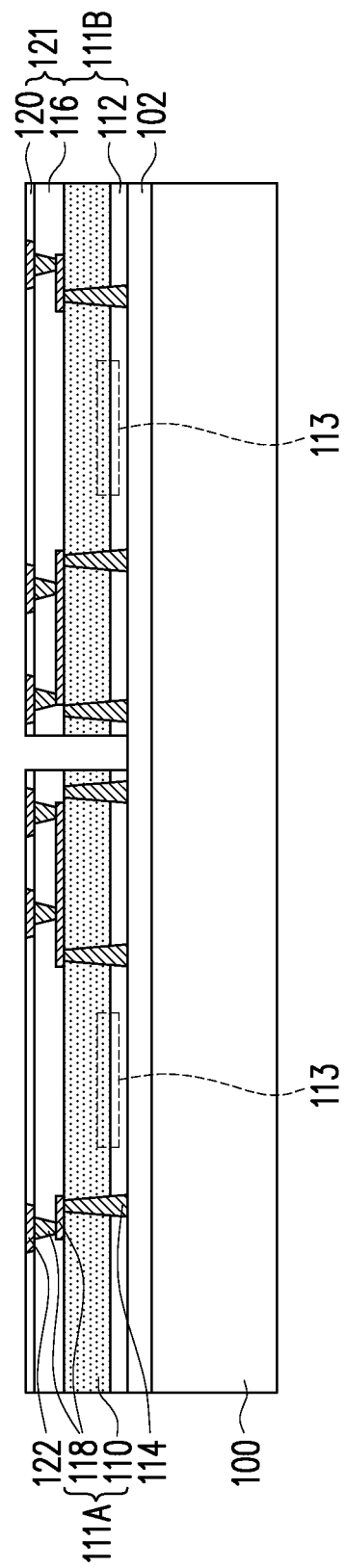

In FIG. 16, a first interface die 111A and a second interface die 111B are attached to a carrier substrate 100. Front-sides of the first interface die 111A and the second interface die 111B are attached to the carrier substrate 100 by a release layer 102. The carrier substrate 100 and the release layer 102 may be formed of materials and using processes the same as or similar to the carrier substrate 100 and the release layer 102, respectively, described above with respect to FIG. 2. The first interface die 111A and the second interface die 111B may be the same as or similar to the interface die 111, described above with respect to FIG. 2. Each of the first interface die 111A and the second interface die 111B may include an interface substrate 110, a dielectric layer 112 on a front-side of the interface substrate 110, active devices 113 formed in and/or on the front-side of the interface substrate 110, and conductive vias 114 extending through the dielectric layer 112 and into the interface substrate 110. The first interface die 111A and the second interface die 111B may be laterally adjacent to one another, and may be separated by a gap.

A backside interconnect structure 121 is formed over a backside of each of the first interface die 111A and the second interface die 111B. The backside interconnect structures 121 include dielectric layers 116, metallization layers 118 in the dielectric layers 116, dielectric layers 120, and bond pads 122 in the dielectric layers 120. The metallization layers 118 are electrically coupled to the conductive vias 114 of the first interface die 111A and the second interface die 111B. The bond pads 122 are electrically coupled to the metallization layers 118 and to the conductive vias 114 of the first interface die 111A and the second interface die 111B through the metallization layers 118. The backside interconnect structures 121 may be formed of materials and using processes the same as or similar to those of the backside interconnect structure 121, described above with respect to FIG. 4. Specifically, the dielectric layers 116, the metallization layers 118, the dielectric layers 120, and the bond pads 122 may be formed of materials and using processes the same as or similar to the dielectric layers 116, the metallization layers 118, the dielectric layer 120, and the bond pads 122, respectively.

In FIG. 17, a first encapsulant 131 is formed on the release layer 102 and around the first interface die 111A and the second interface die 111B. The first encapsulant 131 is deposited on the release layer 102 and around the first interface die 111A, the second interface die 111B, and the backside interconnect structures 121. After formation, the first encapsulant 131 encapsulates the first interface die 111A, the second interface die 111B, and the backside interconnect structures 121. The first encapsulant 131 may be a molding compound, epoxy, or the like. The first encapsulant 131 may be applied by compression molding, transfer molding, or the like. The first encapsulant 131 is formed over the release layer 102 such that the first interface die 111A, the second interface die 111B, and the backside interconnect structures 121 are buried or covered. The first encapsulant 131 is formed in gap regions between the first interface die 111A and the second interface die 111B and between the backside interconnect structures 121. The first encapsulant 131 may be applied in a liquid or a semi-liquid form and subsequently cured.

The first encapsulant 131 is then thinned to expose the bond pads 122 of the backside interconnect structures 121. The thinning process may be a grinding process, a CMP, an etch-back, combinations thereof, or the like. After the thinning process, the top surfaces of the first encapsulant 131, the bond pads 122, and the dielectric layers 120 are coplanar (within process variations). The thinning is performed until the bond pads 122 are exposed. In some embodiments, the thinning removes the portions of the first encapsulant 131 covering the backside interconnect structures 121 until none of the first encapsulant 131 remains over the backside interconnect structures 121.

In FIG. 18, a first integrated circuit die 50A is bonded to the backside interconnect structure 121 over the first interface die 111A by hybrid bonding. A desired type and quantity of integrated circuit dies 50 may be bonded to the backside interconnect structure 121 by hybrid bonding, such as one or more of the first integrated circuit dies 50A. In the illustrated embodiment, a single first integrated circuit die 50A is bonded to the backside interconnect structure 121. The first integrated circuit die 50A may be a logic device, such as a CPU, a GPU, an SoC, a microcontroller, or the like.

The first integrated circuit die 50A is bonded to the backside interconnect structure 121 in a hybrid bonding configuration. The first integrated circuit die 50A is disposed face down such that the front-side of the first integrated circuit die 50A faces the backside interconnect structure 121 and the backside of the first integrated circuit die 50A faces away from the backside interconnect structure 121. This may be referred to as a face-to-back configuration (F2B) as the face of the first integrated circuit die 50A is toward the back of the first interface die 111A. The dielectric layer 68 of the first integrated circuit die 50A may be directly bonded to the dielectric layer 120, and the die connectors 66 of the first integrated circuit die 50A may be directly bonded to the bond pads 122.

The first integrated circuit die 50A is bonded to the backside interconnect structure 121 without the use of solder connections (e.g., micro-bumps or the like). By directly bonding the first integrated circuit die 50A to the backside interconnect structure 121, advantages can be achieved, such as, finer bump pitch; small form factor packages by using hybrid bonds; smaller bonding pitch scalability for chip I/O to realize high density die-to-die interconnects; improved mechanical endurance; improved electrical performance; reduced defects; and increased yield. Further, shorter die-to-die distances may be achieved between the first integrated circuit die 50A and other integrated circuit dies, which has the benefits of smaller form-factor, higher bandwidth, improved power integrity (PI), improved signal integrity (SI), and lower power consumption.

In FIG. 19, bond pads 126 are formed on the backside interconnect structures 121 over the first interface die 111A and the second interface die 111B, a second integrated circuit die 50B is bonded to the backside interconnect structures 121 over the first interface die 111A and the second interface die 111B by solder bonding, and a third integrated circuit die 50C is bonded to the backside interconnect structure 121 over the second interface die 111B by solder bonding. The bond pads 126 and conductive connectors 128 may be formed over the backside interconnect structures 121 of materials and using processes the same as or similar to those of the bond pads 126 and the conductive connectors 128, respectively, described above with respect to FIG. 6.

A desired type and quantity of integrated circuit dies 50 may be bonded to the backside interconnect structure 121 by solder bonding, such as one or more of the second integrated circuit dies 50B and one or more of the third integrated circuit dies 50C. In the illustrated embodiment, a single second integrated circuit die 50B is bonded to the backside interconnect structures 121 over the first interface die 111A and the second interface die 111B and a single third integrated circuit die 50C is bonded to the backside interconnect structure 121 over the second interface die 111B. The second integrated circuit die 50B may be a bridge die, which may be a logic device or a passive device. In embodiments in which the second integrated circuit die 50B is a logic device, the second integrated circuit die 50B may be a CPU, a GPU, an SoC, a microcontroller, or the like. In embodiments in which the second integrated circuit die 50B is a passive device, the second integrated circuit die 50B may be an input-output (IO) die, an SED die, or the like. The third integrated circuit die 50C may be a memory device, such as a DRAM die, an SRAM die, a NAND flash die, an HMC module, an HBM module, or the like. Although the third integrated circuit die 50C is illustrated as a single integrated circuit die, the third integrated circuit die 50C may include a plurality of stacked integrated circuit dies (also referred to as a die stack).

The second integrated circuit die 50B and the third integrated circuit die 50C are attached to the backside interconnect structures 121 with solder bonds, such as with the conductive connectors 128. The second integrated circuit die 50B and the third integrated circuit die 50C may be placed on the backside interconnect structures 121 using, e.g., a pick-and-place tool. Attaching the second integrated circuit die 50B and the third integrated circuit die 50C to the backside interconnect structures 121 may include placing the second integrated circuit die 50B and the third integrated circuit die 50C on the backside interconnect structures 121 and reflowing the conductive connectors 128. The conductive connectors 128 form joints between the bond pads 126 on the backside interconnect structures 121 and the die connectors 66 of the second integrated circuit die 50B and the third integrated circuit die 50C, electrically coupling the first interface die 111A and the second interface die 111B to the second integrated circuit die 50B and the third integrated circuit die 50C through the backside interconnect structures 121.

An underfill material 129 may be formed around the conductive connectors 128, and between the backside interconnect structures 121 and each of the second integrated circuit die 50B and the third integrated circuit die 50C. As illustrated in FIG. 19, the underfill material 129 may be a continuous material, or two separate, discontinuous materials. The underfill material 129 may reduce stress and protect the joints resulting from the reflowing of the conductive connectors 128. The underfill material 129 may be formed of any suitable underfill material, such as a molding compound, an epoxy, or the like. The underfill material 129 may be formed by a capillary flow process after the second integrated circuit die 50B and the third integrated circuit die 50C are attached to the backside interconnect structures 121, or may be formed by a suitable deposition method before the second integrated circuit die 50B and the third integrated circuit die 50C are attached to the backside interconnect structures 121. The underfill material 129 may be applied in a liquid or a semi-liquid form and subsequently cured. In some embodiments, the underfill material 129 is omitted, and the underfill material 129 is omitted in subsequent figures.

The first integrated circuit die 50A, the second integrated circuit die 50B, and the third integrated circuit die 50C may be formed by processes of a same technology node, or may be formed by processes of different technology nodes. For example, the first integrated circuit die 50A may be of a more advanced process node than the second integrated circuit die 50B and/or the third integrated circuit die 50C. The first integrated circuit die 50A, the second integrated circuit die 50B, and/or the third integrated circuit die 50C may have different sizes (e.g., different heights and/or surface areas), or may have the same size (e.g., the same heights and/or surface areas). Other combinations of integrated circuit dies are also possible. In some embodiments, the first integrated circuit die 50A, the second integrated circuit die 50B, and the third integrated circuit die 50C may have thicknesses greater than about 100 μm.

The first integrated circuit die 50A and the third integrated circuit die 50C may be electrically coupled to one another through the backside interconnect structures 121 and the second integrated circuit die 50B. The first integrated circuit die 50A is physically electrically coupled to the backside interconnect structure 121 on the first interface die 111A through hybrid bonds between the die connectors 66 and the bond pads 122. The second integrated circuit die 50B is physically and electrically coupled to the backside interconnect structures 121 on the first interface die 111A and the second interface die 111B through solder bonds between the die connectors 66 and the bond pads 126. The third integrated circuit die 50C is physically and electrically coupled to the backside interconnect structure 121 on the second interface die 111B through solder bonds between the die connectors 66 and the bond pads 126. In some embodiments, the first integrated circuit die 50A may be a logic die, the second integrated circuit die 50B may be a bridge die, and the third integrated circuit die 50C may be a memory die. The first integrated circuit die 50A has a relatively smaller pitch of the die connectors 66 and a higher circuit density, while the second integrated circuit die 50B and the third integrated circuit die 50C have relatively larger pitches of the die connectors 66 and lower circuit densities. Bonding the first integrated circuit die 50A to the backside interconnect structure 121 by hybrid bonding achieves advantages, such as finer bump pitch, higher bandwidth, and improved device performance. Bonding the second integrated circuit die 50B and the third integrated circuit die 50C to the backside interconnect structures 121 by solder bonding reduces costs.

Figure 20:
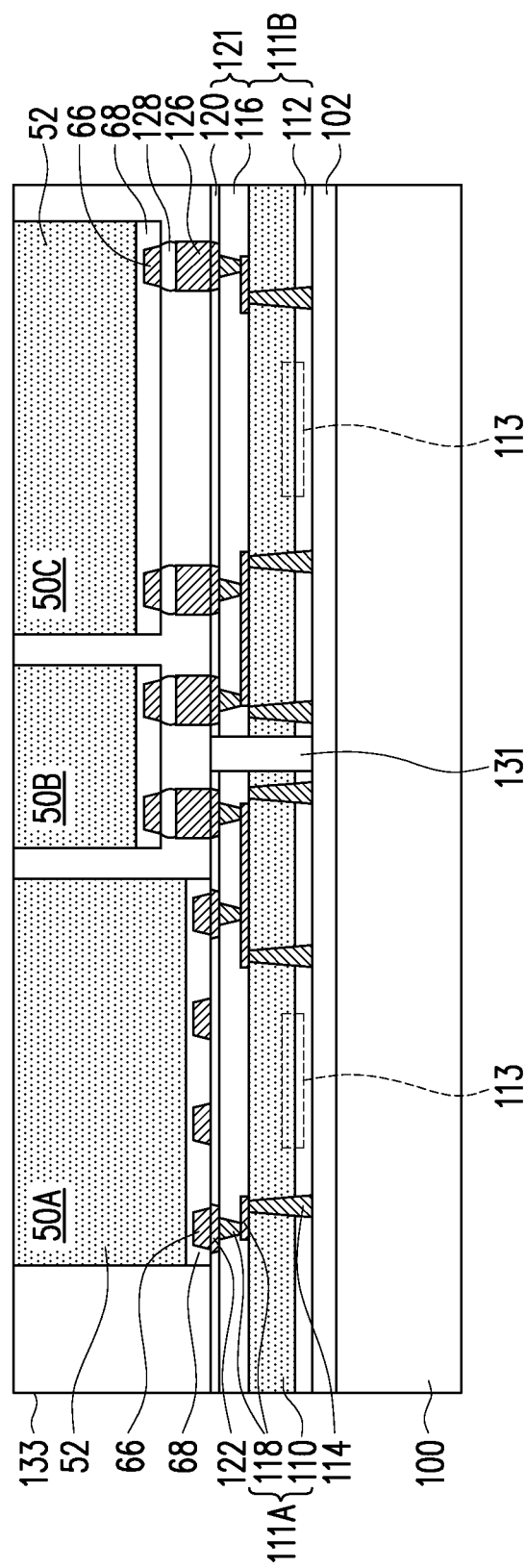

In FIG. 20, a second encapsulant 133 is formed on the first interface die 111A, the second interface die 111B, and the first encapsulant 131 and around the first integrated circuit die 50A, the second integrated circuit die 50B, and the third integrated circuit die 50C. The second encapsulant 133 may be formed of materials and using processes the same as or similar to the encapsulant 130, described above with respect to FIG. 8. The second encapsulant 133 may be thinned to expose backsides of the first integrated circuit die 50A, the second integrated circuit die 50B, and the third integrated circuit die 50C.

Figure 21:
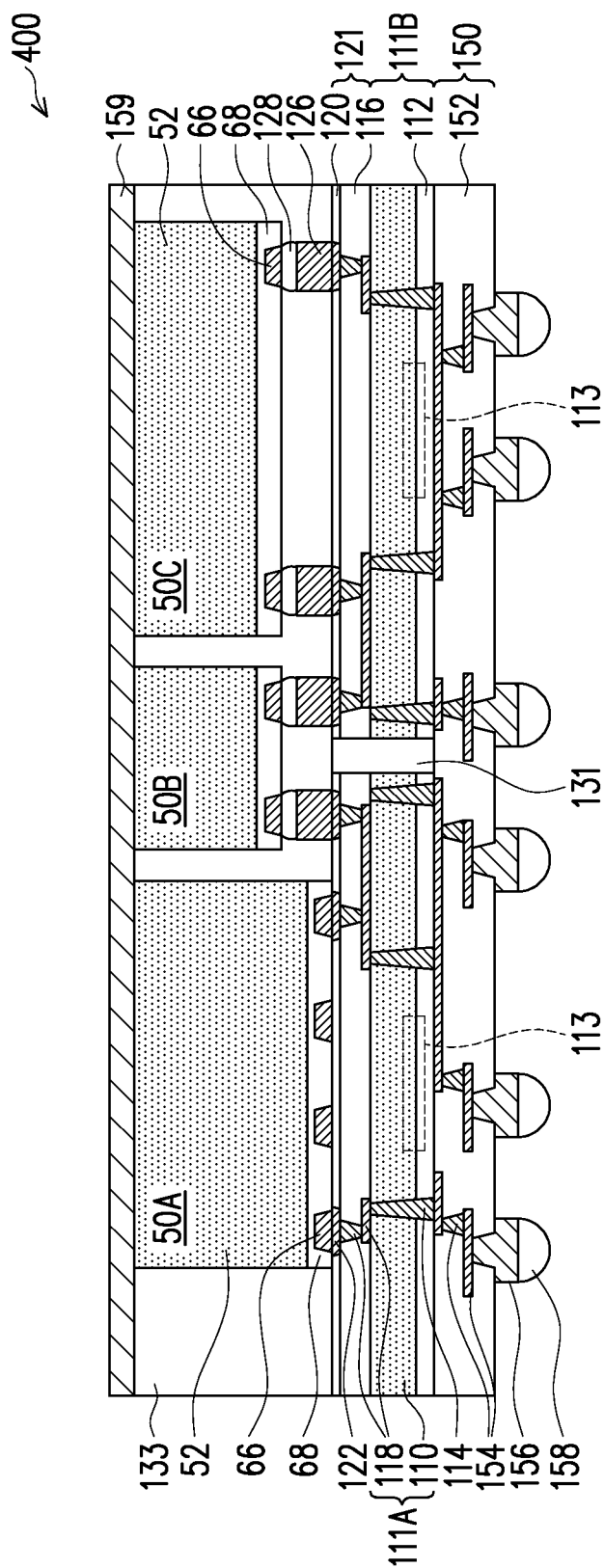

In FIG. 21, the carrier substrate 100 is removed; a front-side interconnect structure 150 is formed on front-sides of the first interface die 111A and the second interface die 111B; and a heat dissipating layer 159 is optionally formed on the second encapsulant 133, the first integrated circuit die 50A, the second integrated circuit die 50B, and the third integrated circuit die 50C. The heat dissipation layer 159, the encapsulant 130, the first integrated circuit die 50A, the second integrated circuit die 50B, the third integrated circuit die 50C, the first interface die 111A, and the second interface die 111B form a third packaged component 400. A carrier substrate de-bonding is performed to detach the carrier substrate 100 from the first interface die 111A, the second interface die 111B, and the first encapsulant 131. In some embodiments, the de-bonding includes projecting a light, such as a laser light or an UV light, on the release layer 102 so that the release layer 102 decomposes under the heat of the light and the carrier substrate 100 can be removed. As illustrated in FIG. 21, surfaces of the first interface die 111A, the second interface die 111B, and the first encapsulant 131 may be exposed after removing the carrier substrate 100 and the release layer 102.

The front-side interconnect structure 150 may be formed of materials and using processes the same as or similar to those of the front-side interconnect structure 150, described above with respect to FIG. 10. The front-side interconnect structure 150 includes dielectric layers 152 and metallization layers 154 in the dielectric layers 152. The dielectric layers 152 and the metallization layers 154 may be formed of materials and using processes the same as or similar to the dielectric layers 152 and the metallization layers 154, respectively.

UBMs 156 and conductive connectors 158 are formed for external connection to the front-side interconnect structure 150. The UBMs 156 and the conductive connectors 158 may be formed of materials and using processes the same as or similar to the UBMs 156 and the conductive connectors 158, respectively, discussed above with respect to FIG. 10. The UBMs 156 include bump portions on and extending along a top surface of an uppermost dielectric layer of the dielectric layers 152 of the front-side interconnect structure 150, and include via portions extending through the uppermost dielectric layer of the dielectric layers 152 of the front-side interconnect structure 150. The via portions may be physically and electrically coupled to an uppermost metallization layer of the metallization layers 154 of the front-side interconnect structure 150. The UBMs 156 may be electrically coupled to the conductive vias 114, the first integrated circuit die 50A, the second integrated circuit die 50B, and the third integrated circuit die 50C.

The heat dissipation layer 159 is formed over the second encapsulant 133, the first integrated circuit die 50A, the second integrated circuit die 50B, and the third integrated circuit die 50C. The heat dissipation layer 159 is formed a material with high thermal conductivity, such as a metal or metal nitride. In some embodiments, the heat dissipation layer 159 may be formed of aluminum, titanium, titanium nitride, nickel, nickel vanadium, silver, gold, copper, combinations thereof, or the like. The heat dissipation layer 159 may be conformally formed by a PVD process, such as sputtering or evaporation; a plating process, such as electroless plating or electroplating; a printing process, such as inkjet printing; or the like. In some embodiments, the heat dissipation layer 159 is formed of copper by a sputtering process. The heat dissipation layer 159 may be included to increase heat dissipation from the first integrated circuit die 50A, the second integrated circuit die 50B, and the third integrated circuit die 50C. In some embodiments, the heat dissipation layer 159 may be formed over the second encapsulant 133, the first integrated circuit die 50A, the second integrated circuit die 50B, and the third integrated circuit die 50C before removing the carrier substrate 100. In some embodiments, the heat dissipation layer 159 may be omitted.

Including both the first integrated circuit die 50A hybrid bonded to the backside interconnect structure 121 over the first interface die 111A and the second integrated circuit die 50B and the third integrated circuit die 50C solder bonded to the backside interconnect structures 121 over the first interface die 111A and the second interface die 111B allows for benefits from both hybrid bonding and solder bonding to be achieved. For example, hybrid bonding the first integrated circuit die 50A allows for dies with small pitches to be bonded to the backside interconnect structure 121, provides higher bandwidth, and provides improved device performance. Solder bonding the second integrated circuit die 50B and the third integrated circuit die 50C reduces costs, while still providing sufficiently small bond pitches.

FIGS. 22 through 26 illustrate an embodiment in which three integrated circuit dies 50 are bonded to two interface dies 111. Specifically, as illustrated in FIG. 19, a first integrated circuit die 50A is hybrid bonded on a first interface die 111A, a second integrated circuit die 50B is solder bonded on the first interface die 111A and a second interface die 111B, and a third integrated circuit die 50C is solder bonded on the second interface die 111B. FIGS. 22 through 26 illustrate an embodiment in which a package has a face-to-face structure, in which the integrated circuit dies 50 have their front surfaces facing the front surfaces of the interface dies 111. FIGS. 22 through 26 illustrate cross-sectional views of intermediate steps during a process for forming a fourth packaged component 500 (illustrated in FIG. 26), in accordance with some embodiments.

Figure 22:
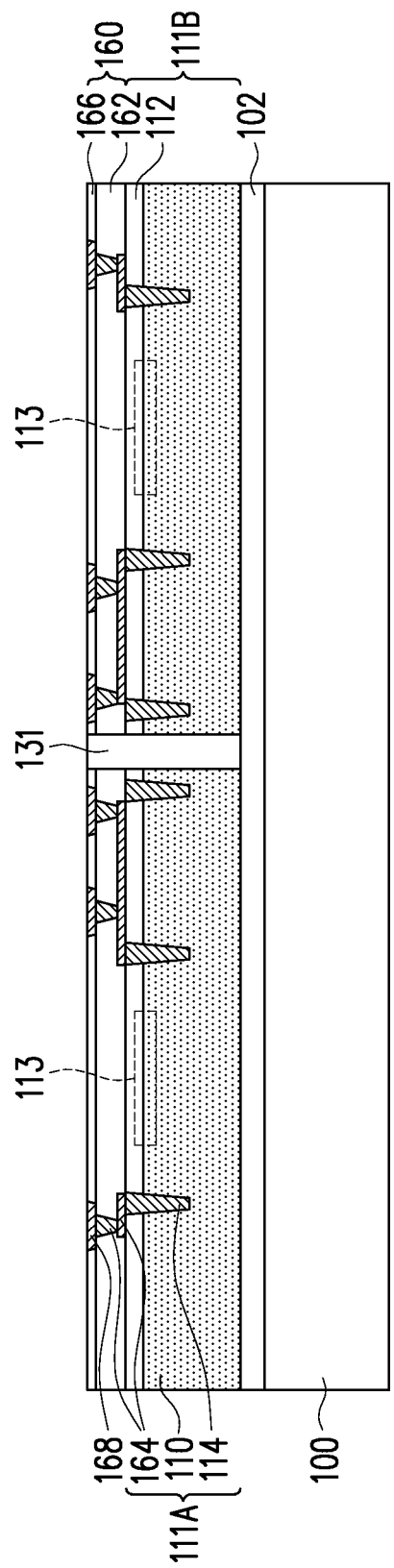

In FIG. 22, a first interface die 111A and a second interface die 111B are attached to a carrier substrate 100. Backsides of the first interface die 111A and the second interface die 111B are attached to the carrier substrate 100 by a release layer 102. The carrier substrate 100 and the release layer 102 may be formed of materials and using processes the same as or similar to the carrier substrate 100 and the release layer 102, respectively, described above with respect to FIG. 2. The first interface die 111A and the second interface die 111B may be the same as or similar to the interface die 111, described above with respect to FIG. 2. Each of the first interface die 111A and the second interface die 111B may include an interface substrate 110, a dielectric layer 112 on a front-side of the interface substrate 110, active devices 113 formed in and/or on the front-side of the interface substrate 110, and conductive vias 114 extending through the dielectric layer 112 and into the interface substrate 110. The first interface die 111A and the second interface die 111B may be laterally adjacent to one another, and may be separated by a gap.

A front-side interconnect structure 160 is formed over a front-side of each of the first interface die 111A and the second interface die 111B. The front-side interconnect structures 160 include dielectric layers 162, metallization layers 164 in the dielectric layers 162, dielectric layers 166, and bond pads 168 in the dielectric layers 166. The metallization layers 164 are electrically coupled to the conductive vias 114 of the first interface die 111A and the second interface die 111B. The bond pads 168 are electrically coupled to the metallization layers 164 and to the conductive vias 114 of the first interface die 111A and the second interface die 111B through the metallization layers 164. The front-side interconnect structure 160 may be formed of materials and using processes the same as or similar to those of the backside interconnect structure 121, described above with respect to FIG. 4. Specifically, the dielectric layers 162, the metallization layers 164, the dielectric layers 166, and the bond pads 168 may be formed of materials and using processes the same as or similar to the dielectric layers 116, the metallization layers 118, the dielectric layer 120, and the bond pads 122, respectively.

A first encapsulant 131 is formed on the release layer 102 and around the first interface die 111A and the second interface die 111B. The first encapsulant 131 may be formed of materials and using processes the same as or similar to the first encapsulant 131, discussed above with respect to FIG. 17. The first encapsulant 131 is thinned to expose the bond pads 168 of the front-side interconnect structure 160. After the thinning process, the top surfaces of the first encapsulant 131, the bond pads 168, and the dielectric layers 166 are coplanar (within process variations). The thinning is performed until the bond pads 168 are exposed. In some embodiments, the thinning removes portions of the first encapsulant 131 covering the front-side interconnect structure 160 until none of the first encapsulant 131 remains over the front-side interconnect structure 160.

Figure 23:
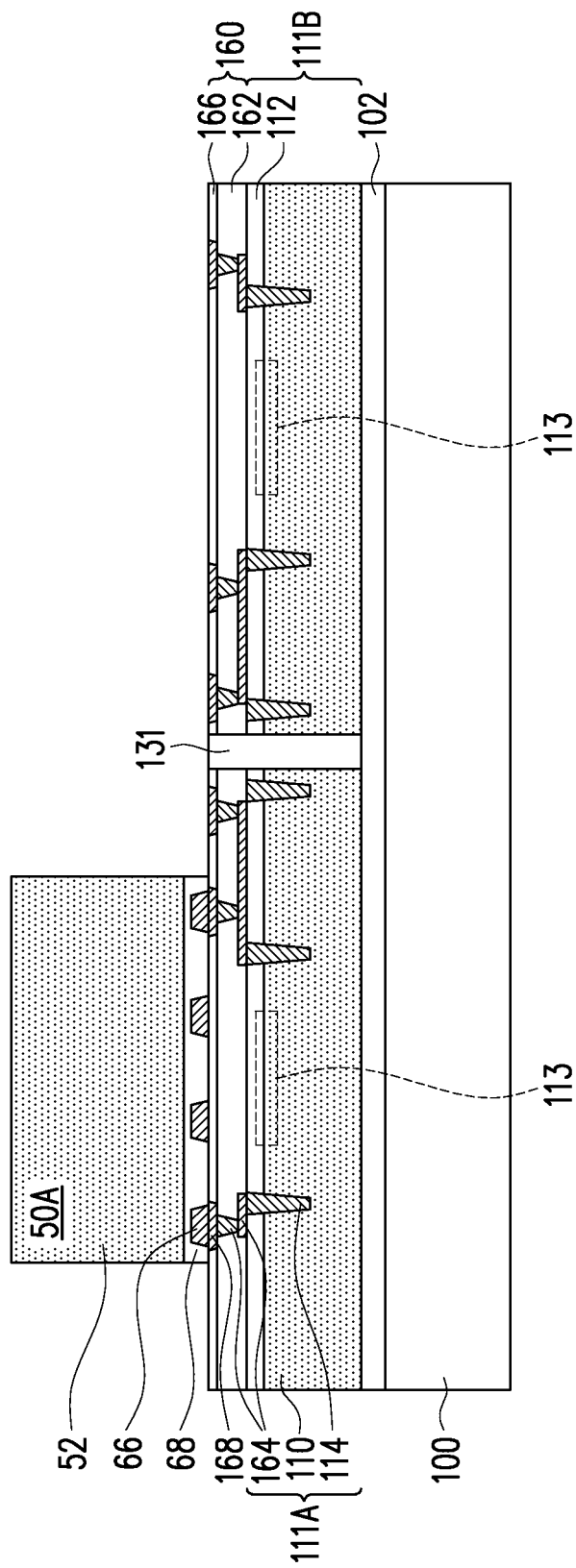

In FIG. 23, a first integrated circuit die 50A is bonded to the front-side interconnect structure 160 over the first interface die 111A by hybrid bonding. A desired type and quantity of integrated circuit dies 50 may be bonded to the front-side interconnect structure 160 by hybrid bonding, such as one or more of the first integrated circuit dies 50A. In the illustrated embodiment, a single first integrated circuit die 50A is bonded to the front-side interconnect structure 160. The first integrated circuit die 50A may be a logic device, such as a CPU, a GPU, an SoC, a microcontroller, or the like.

The first integrated circuit die 50A is bonded to the front-side interconnect structure 160 in a hybrid bonding configuration. The first integrated circuit die 50A is disposed face down such that the front-side of the first integrated circuit die 50A faces the front-side interconnect structure 160 and the backside of the first integrated circuit die 50A faces away from the front-side interconnect structure 160. This may be referred to as a face-to-face configuration (F2F)

as the face of the first integrated circuit die 50A is toward the face of the first interface die 111A. The dielectric layer 68 of the first integrated circuit die 50A may be directly bonded to the dielectric layer 166, and the die connectors 66 of the first integrated circuit die 50A may be directly bonded to the bond pads 168.

The first integrated circuit die 50A is bonded to the front-side interconnect structure 160 without the use of solder connections (e.g., micro-bumps or the like). By directly bonding the first integrated circuit die 50A to the front-side interconnect structure 160, advantages can be achieved, such as, finer bump pitch; small form factor packages by using hybrid bonds; smaller bonding pitch scalability for chip I/O to realize high density die-to-die interconnects; improved mechanical endurance; improved electrical performance; reduced defects; and increased yield. Further, shorter die-to-die distances may be achieved between the first integrated circuit die 50A and other integrated circuit dies, which has the benefits of smaller formfactor, higher bandwidth, improved power integrity (PI), improved signal integrity (SI), and lower power consumption.

Figure 24:
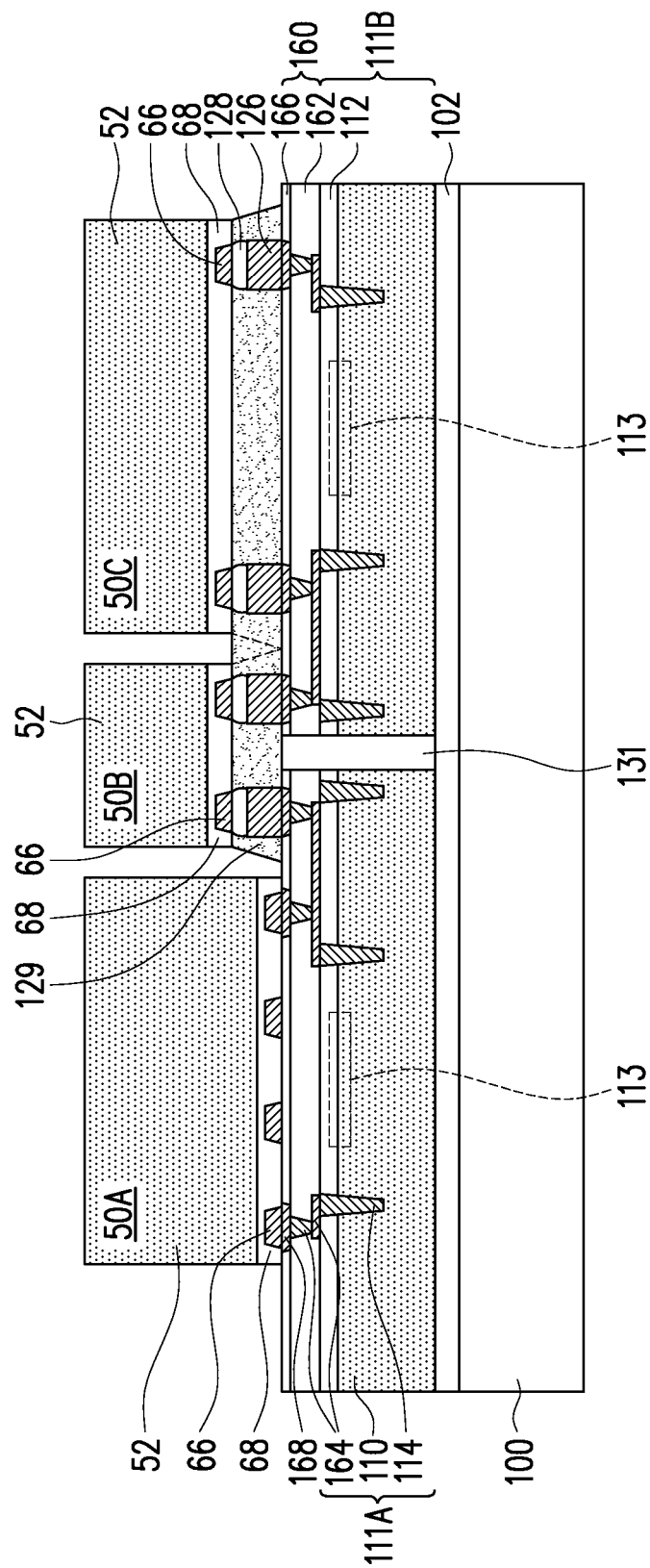

In FIG. 24, bond pads 126 are formed on the front-side interconnect structures 160 over the first interface die 111A and the second interface die 111B, a second integrated circuit die 50B is bonded to the front-side interconnect structures 160 over the first interface die 111A and the second interface die 111B by solder bonding, and a third integrated circuit die 50C is bonded to the front-side interconnect structure 160 over the second interface die 111B by solder bonding. The bond pads 126 and conductive connectors 128 may be formed over the front-side interconnect structures 160 of materials and using processes the same as or similar to those of the bond pads 126 and the conductive connectors 128, respectively, described above with respect to FIG. 6.

A desired type and quantity of integrated circuit dies 50 may be bonded to the front-side interconnect structure 160 by solder bonding, such as one or more of the second integrated circuit dies 50B and one or more of the third integrated circuit dies 50C. In the illustrated embodiment, a single second integrated circuit die 50B is bonded to the front-side interconnect structures 160 over the first interface die 111A and the second interface die 111B and a single third integrated circuit die 50C is bonded to the front-side interconnect structure 160 over the second interface die 111B. The second integrated circuit die 50B may be a bridge die, which may be a logic device or a passive device. In embodiments in which the second integrated circuit die 50B is a logic device, the second integrated circuit die 50B may be a CPU, a GPU, an SoC, a microcontroller, or the like. In embodiments in which the second integrated circuit die 50B is a passive device, the second integrated circuit die 50B may be an input-output (IO) die, an SED die, or the like. The third integrated circuit die 50C may be a memory device, such as a DRAM die, an SRAM die, a NAND flash die, an HMC module, an HBM module, or the like. Although the third integrated circuit die 50C is illustrated as a single integrated circuit die, the third integrated circuit die 50C may include a plurality of stacked integrated circuit dies (also referred to as a die stack).

The second integrated circuit die 50B and the third integrated circuit die 50C are attached to the front-side interconnect structures 160 with solder bonds, such as with the conductive connectors 128. The second integrated circuit die 50B and the third integrated circuit die 50C may be placed on the front-side interconnect structures 160 using, e.g., a pick-and-place tool. Attaching the second integrated circuit die 50B and the third integrated circuit die 50C to the front-side interconnect structures 160 may include placing the second integrated circuit die 50B and the third integrated circuit die 50C on the front-side interconnect structures 160 and reflowing the conductive connectors 128. The conductive connectors 128 form joints between the bond pads 126 on the front-side interconnect structure 160 and the die connectors 66 of the second integrated circuit die 50B and the third integrated circuit die 50C, electrically coupling the first interface die 111A and the second interface die 111B to the second integrated circuit die 50B and the third integrated circuit die 50C through the front-side interconnect structures 160.

An underfill material 129 may be formed around the conductive connectors 128, and between the front-side interconnect structures 160 and each of the second integrated circuit die 50B and the third integrated circuit die 50C. As illustrated in FIG. 24, the underfill material 129 may be a continuous material, or two separate, discontinuous materials. The underfill material 129 may reduce stress and protect the joints resulting from the reflowing of the conductive connectors 128. The underfill material 129 may be formed of any suitable underfill material, such as a molding compound, an epoxy, or the like. The underfill material 129 may be formed by a capillary flow process after the second integrated circuit die 50B and the third integrated circuit die 50C are attached to the front-side interconnect structures 160, or may be formed by a suitable deposition method before the second integrated circuit die 50B and the third integrated circuit die 50C are attached to the front-side interconnect structures 160. The underfill material 129 may be applied in a liquid or a semi-liquid form and subsequently cured. In some embodiments, the underfill material 129 is omitted, and the underfill material 129 is omitted in subsequent figures.

The first integrated circuit die 50A, the second integrated circuit die 50B, and the third integrated circuit die 50C may be formed by processes of a same technology node, or may be formed by processes of different technology nodes. For example, the first integrated circuit die 50A may be of a more advanced process node than the second integrated circuit die 50B and/or the third integrated circuit die 50C. The first integrated circuit die 50A, the second integrated circuit die 50B, and/or the third integrated circuit die 50C may have different sizes (e.g., different heights and/or surface areas), or may have the same size (e.g., the same heights and/or surface areas). Other combinations of integrated circuit dies are also possible. In some embodiments, the first integrated circuit die 50A, the second integrated circuit die 50B, and the third integrated circuit die 50C may have thicknesses greater than about 100 μm.

The first integrated circuit die 50A and the third integrated circuit die 50C may be electrically coupled to one another through the front-side interconnect structures 160 and the second integrated circuit die 50B. The first integrated circuit die 50A is physically electrically coupled to the front-side interconnect structure 160 on the first interface die 111A through hybrid bonds between the die connectors 66 and the bond pads 168. The second integrated circuit die 50B is physically and electrically coupled to the front-side interconnect structures 160 on the first interface die 111A and the second interface die 111B through solder bonds between the die connectors 66 and the bond pads 126. The third integrated circuit die 50C is physically and electrically coupled to the front-side interconnect structure 160 on the second interface die 111B through solder bonds between the die connectors 66 and the bond pads 126. In some embodiments, the first integrated circuit die 50A may be a logic die, the second integrated circuit die 50B may be a bridge die, and the third integrated circuit die 50C may be a memory die. The first integrated circuit die 50A has a relatively smaller pitch of the die connectors 66 and a higher circuit density, while the second integrated circuit die 50B and the third integrated circuit die 50C have relatively larger pitches of the die connectors 66 and lower circuit densities. Bonding the first integrated circuit die 50A to the front-side interconnect structure 160 by hybrid bonding achieves advantages, such as finer bump pitch, higher bandwidth, and improved device performance. Bonding the second integrated circuit die 50B and the third integrated circuit die 50C to the front-side interconnect structure 160 by solder bonding reduces costs.

Figure 25:
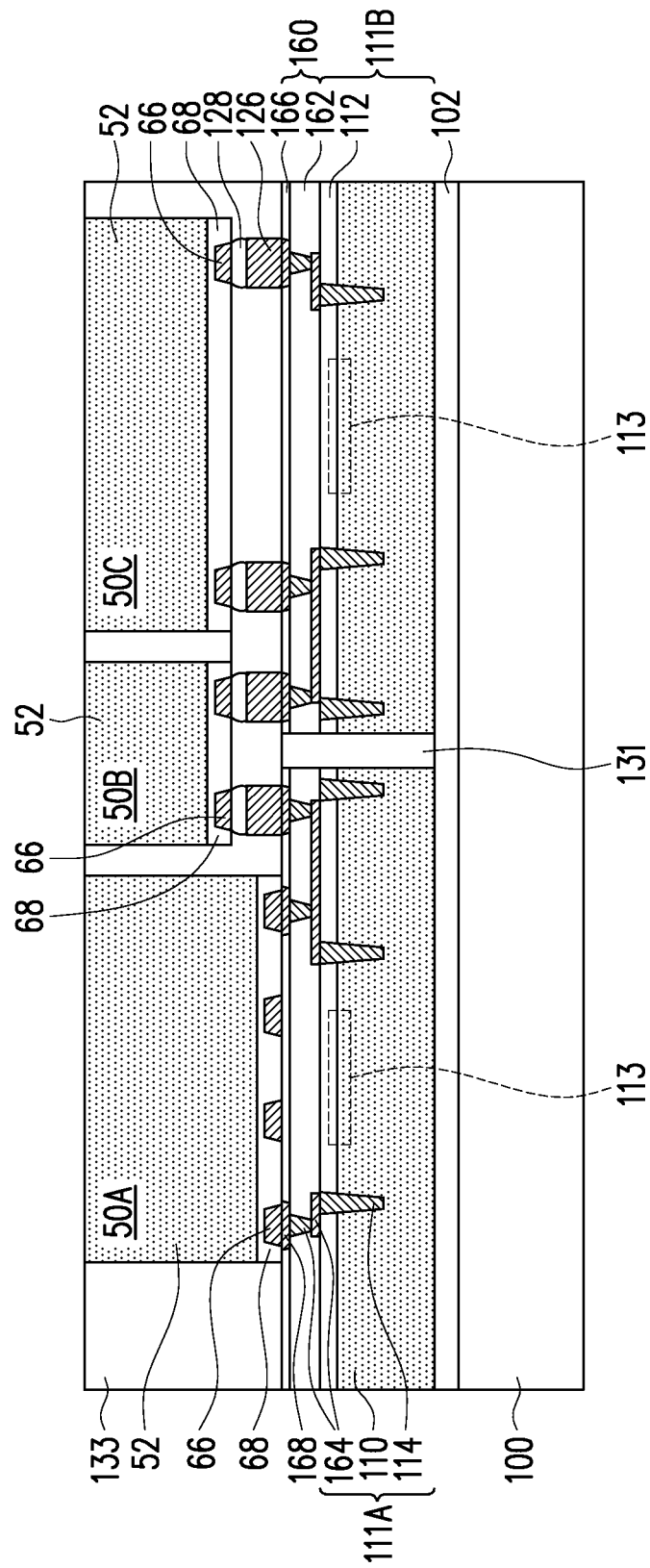

In FIG. 25, a second encapsulant 133 is formed on the first interface die 111A, the second interface die 111B, and the first encapsulant 131 and around the first integrated circuit die 50A, the second integrated circuit die 50B, and the third integrated circuit die 50C. The second encapsulant 133 may be formed of materials and using processes the same as or similar to the encapsulant 130, described above with respect to FIG. 8. The second encapsulant 133 may be thinned to expose backsides of the first integrated circuit die 50A, the second integrated circuit die 50B, and the third integrated circuit die 50C.

Figure 26:
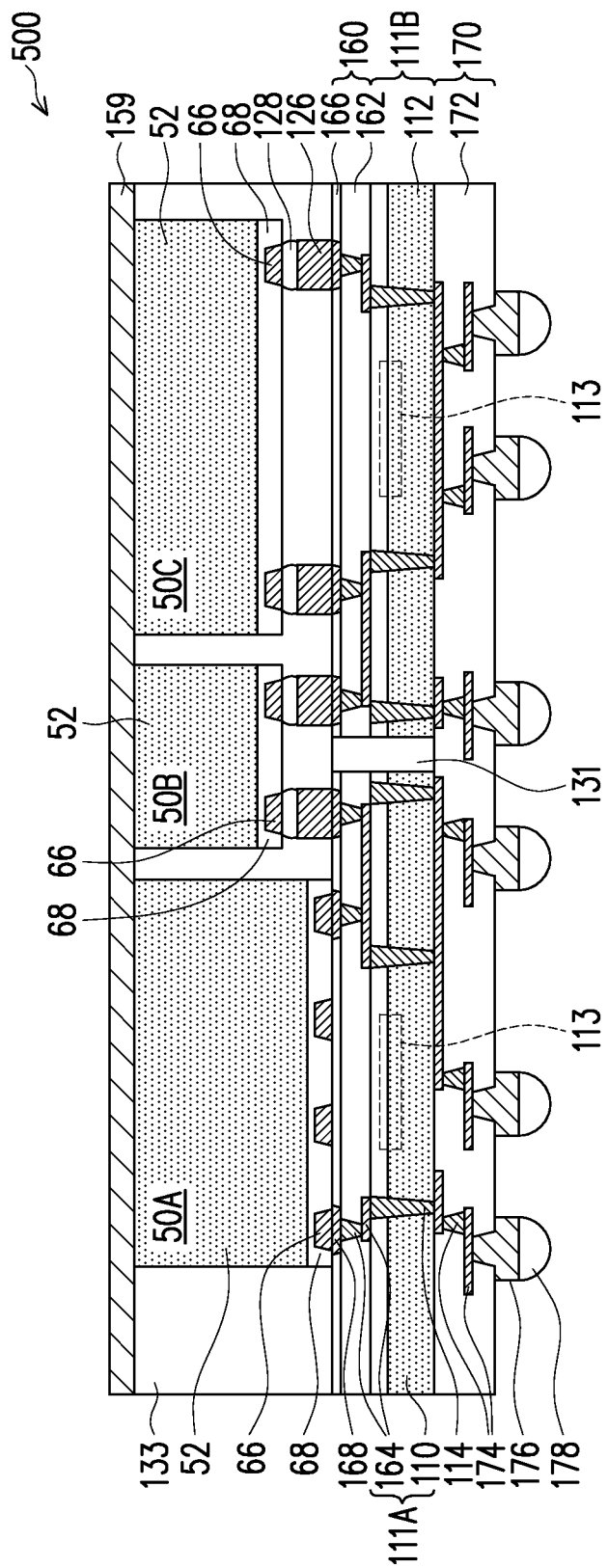

In FIG. 26, the carrier substrate 100 is removed; the backsides of the interface substrates 110 and the first encapsulant 131 are thinned; a backside interconnect structure 170 is formed on the backsides of the interface substrates 110 and the first encapsulant 131; and a heat dissipating layer 159 is optionally formed on the encapsulant 130, the first integrated circuit die 50A, and the second integrated circuit die 50B. The heat dissipation layer 159, the encapsulant 130, the first integrated circuit die 50A, the second integrated circuit die 50B, the third integrated circuit die 50C, the first interface die 111A, and the second interface die 111B form a fourth packaged component 500. A carrier substrate de-bonding is performed to detach the carrier substrate 100 from the first interface die 111A, the second interface die 111B, and the first encapsulant 131. In some embodiments, the de-bonding includes projecting a light, such as a laser light or an UV light, on the release layer 102 so that the release layer 102 decomposes under the heat of the light and the carrier substrate 100 can be removed. As illustrated in FIG. 26, surfaces of the first interface die 111A, the second interface die 111B, and the first encapsulant 131 may be exposed after removing the carrier substrate 100 and the release layer 102.

The interface substrates 110 and the first encapsulant 131 may be thinned by a planarization process applied to the interface substrates 110 and the first encapsulant 131 to expose the conductive vias 114. After the conductive vias 114 are exposed, the conductive vias 114 extend through the interface substrates 110 and may be referred to as TSVs. The planarization may remove portions of the interface substrates 110 opposite the dielectric layer 112 such that the conductive vias 114 are exposed. The planarization may be achieved by any suitable process, such as a CMP, a grinding process, an etch-back process, the like, or a combination thereof. After the planarization, the conductive vias 114 may extend completely through the interface substrates 110 and provide interconnection between opposite sides of the interface substrates 110.

The backside interconnect structure 170 may be formed of materials and using processes the same as or similar to those of the front-side interconnect structure 150, described above with respect to FIG. 10. The backside interconnect structure 170 includes dielectric layers 172 and metallization layers 174 in the dielectric layers 172. The dielectric layers 172 and the metallization layers 174 may be formed of materials and using processes the same as or similar to the dielectric layers 152 and the metallization layers 154, respectively.

UBMs 176 and conductive connectors 178 are formed for external connection to the backside interconnect structure 170. The UBMs 176 and the conductive connectors 178 may be formed of materials and using processes the same as or similar to the UBMs 156 and the conductive connectors 158, respectively, discussed above with respect to FIG. 10. The UBMs 176 include bump portions on and extending along a top surface of an uppermost dielectric layer of the dielectric layers 172 of the backside interconnect structure 170, and include via portions extending through the uppermost dielectric layer of the dielectric layers 172 of the backside interconnect structure 170. The via portions may be physically and electrically coupled to an uppermost metallization layer of the metallization layers 174 of the backside interconnect structure 170. The UBMs 176 may be electrically coupled to the conductive vias 114, the first integrated circuit die 50A, and the second integrated circuit die 50B.

The heat dissipation layer 159 is formed over the encapsulant 130, the first integrated circuit die 50A, and the second integrated circuit die 50B. The heat dissipation layer 159 is formed a material with high thermal conductivity, such as a metal or metal nitride. In some embodiments, the heat dissipation layer 159 may be formed of aluminum, titanium, titanium nitride, nickel, nickel vanadium, silver, gold, copper, combinations thereof, or the like. The heat dissipation layer 159 may be conformally formed by a PVD process, such as sputtering or evaporation; a plating process, such as electroless plating or electroplating; a printing process, such as inkjet printing; or the like. In some embodiments, the heat dissipation layer 159 is formed of copper by a sputtering process. The heat dissipation layer 159 may be included to increase heat dissipation from the first integrated circuit die 50A and the second integrated circuit die 50B. In some embodiments, the heat dissipation layer 159 may be formed over the encapsulant 130, the first integrated circuit die 50A, and the second integrated circuit die 50B before attaching the encapsulant 130, the first integrated circuit die 50A, and the second integrated circuit die 50B to the carrier substrate 140. In some embodiments, the heat dissipation layer 159 may be omitted.

Including both the first integrated circuit die 50A hybrid bonded to the front-side interconnect structure 160 over the first interface die 111A and the second integrated circuit die 50B and the third integrated circuit die 50C solder bonded to the front-side interconnect structures 160 over the first interface die 111A and the second interface die 111B allows for benefits from both hybrid bonding and solder bonding to be achieved. For example, hybrid bonding the first integrated circuit die 50A allows for dies with small pitches to be bonded to the front-side interconnect structure 160, provides higher bandwidth, and provides improved device performance. Solder bonding the second integrated circuit die 50B and the third integrated circuit die 50C reduces costs, while still providing sufficiently small bond pitches.

Embodiments may achieve advantages. Bonding the first integrated circuit dies 50A to the interface dies 111 through hybrid bonding allows for dies with small pitches to be bonded to the interface dies 111, provides higher bandwidth, and provides improved device performance. Bonding the second integrated circuit dies 50B and/or the third integrated circuit dies 50C to the interface dies 111 through solder bonding reduces costs, while still providing sufficiently small bond pitches.

The bonding processes described above have been described as being at the die level, wherein the integrated circuit dies 50 are bonded to the interface dies 111 after the integrated circuit dies 50 are bonded to the interface dies 111 are singulated into separate dies. Alternatively, the bonding may be performed at the die-to-wafer level, or the wafer-to-wafer level, and subsequent singulation processes may be performed.

In accordance with an embodiment, a package includes a first interposer, the first interposer including a first redistribution structure; a first die bonded to a first surface of the first redistribution structure with a dielectric-to-dielectric bond and a metal-to-metal bond; a second die bonded to the first surface of the first redistribution structure with a first solder bond; an encapsulant around the first die and the second die; and a plurality of conductive connectors on a second side of the first redistribution structure opposite to the first die and the second die. In an embodiment, the first die includes a logic die, and the second die includes a memory die. In an embodiment, the package further includes a second interposer adjacent the first interposer, the second interposer including a second redistribution structure, the second die being bonded to a first surface of the second redistribution structure with a second solder bond. In an embodiment, the package further includes a third die bonded to the first surface of the second redistribution structure with a third solder bond. In an embodiment, the package further includes a second encapsulant extending from the first interposer to the second interposer. In an embodiment, a top surface of the encapsulant, a top surface of the first die, and a top surface of the second die are level with one another. In an embodiment, the package further includes an under-bump metallization on the first surface of the first redistribution structure, the second die being bonded to the first redistribution structure by the first solder bond on the under-bump metallization, and a surface of the under-bump metallization is level with a surface of the first die.

In accordance with another embodiment, a semiconductor package includes a first interface die; a second interface die adjacent the first interface die; a first encapsulant extending from the first interface die to the second interface die; a first integrated circuit die bonded to the first interface die by a dielectric-to-dielectric bond and a metal-to-metal bond; and a second integrated circuit die bonded to the second interface die by a first solder bond. In an embodiment, the second integrated circuit die is further bonded to the first interface die by a second solder bond. In an embodiment, the semiconductor package further includes a third integrated circuit die bonded to the second interface die by a third solder bond. In an embodiment, the first integrated circuit die is a logic die, the second integrated circuit die is a bridge die, and the third integrated circuit die is a memory die. In an embodiment, the first interface die includes a first interconnect structure, the first integrated circuit die is bonded to a first surface of the first interconnect structure, the second interface die includes a second interconnect structure, the second integrated circuit die is bonded to a second surface of the second interconnect structure, and the first surface and the second surface are level. In an embodiment, the semiconductor package further includes a second encapsulant around the first integrated circuit die and the second integrated circuit die, the second encapsulant physically contacting the first integrated circuit die, the second integrated circuit die, the first interface die, and the second interface die.

In accordance with yet another embodiment, a method includes providing a first interposer including a first interconnect structure on a first interposer substrate; bonding a first die to the first interconnect structure, bonding the first die including directly bonding a first insulating layer of the first die to a bonding layer of the first interconnect structure and directly bonding a first die connector of the first die to a first bond pad of the first interconnect structure; bonding a second die to the first interconnect structure, bonding the second die including solder bonding a second die connector of the second die to a second bond pad of the first interconnect structure; and encapsulating the first die and the second die in a molding compound. In an embodiment, the method further includes forming a first under-bump metallization on the second bond pad; forming a conductive connector on the first under-bump metallization; and reflowing the conductive connector to bond the second die to the first interconnect structure. In an embodiment, the method further includes planarizing the molding compound, the first die, and the second die. In an embodiment, the method further includes forming an underfill material between the second die and the first interconnect structure, the underfill material surrounding solder joints formed between the second die and the first interconnect structure. In an embodiment, the molding compound is formed surrounding solder joints formed between the second die and the first interconnect structure. In an embodiment, the method further includes providing a second interposer adjacent the first interposer, the second interposer including a second interconnect structure on a second interposer substrate, bonding the second die to the first interconnect structure bonds the second die to the second interconnect structure by solder bonding. In an embodiment, the method further includes bonding a third die to the second interconnect structure, bonding the third die includes solder bonding a third die connector of the third die to a third bond pad of the second interconnect structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
    a first interposer, wherein the first interposer comprises a first redistribution structure;
    a first die bonded to a first surface of the first redistribution structure with a dielectric-to-dielectric bond and a metal-to-metal bond;
    a second die bonded to the first surface of the first redistribution structure with a first solder bond;
    an encapsulant around the first die and the second die; and
    a plurality of conductive connectors on a second side of the first redistribution structure opposite to the first die and the second die.

2. The package of claim 1, wherein the first die comprises a logic die, and wherein the second die comprises a memory die.

3. The package of claim 1, further comprising a second interposer adjacent the first interposer, wherein the second interposer comprises a second redistribution structure, wherein the second die is bonded to a first surface of the second redistribution structure with a second solder bond.

4. The package of claim 3, further comprising a third die bonded to the first surface of the second redistribution structure with a third solder bond.

5. The package of claim 3, further comprising a second encapsulant extending from the first interposer to the second interposer.

6. The package of claim 1, wherein a top surface of the encapsulant, a top surface of the first die, and a top surface of the second die are level with one another.

7. The package of claim 1, further comprising an under-bump metallization on the first surface of the first redistribution structure, wherein the second die is bonded to the first redistribution structure by the first solder bond on the under-bump metallization, and wherein a surface of the under-bump metallization is level with a surface of the first die.

8. A semiconductor package comprising:
a first interface die;
a second interface die adjacent the first interface die;
a first encapsulant extending from the first interface die to the second interface die;
a first integrated circuit die bonded to the first interface die by a dielectric-to-dielectric bond and a metal-to-metal bond; and
a second integrated circuit die bonded to the second interface die by a first solder bond.

9. The semiconductor package of claim 8, wherein the second integrated circuit die is further bonded to the first interface die by a second solder bond.

10. The semiconductor package of claim 9, further comprising a third integrated circuit die bonded to the second interface die by a third solder bond.

11. The semiconductor package of claim 10, wherein the first integrated circuit die is a logic die, wherein the second integrated circuit die is a bridge die, and wherein the third integrated circuit die is a memory die.

12. The semiconductor package of claim 8, wherein the first interface die comprises a first interconnect structure, wherein the first integrated circuit die is bonded to a first surface of the first interconnect structure, wherein the second interface die comprises a second interconnect structure, wherein the second integrated circuit die is bonded to a second surface of the second interconnect structure, and wherein the first surface and the second surface are level.

13. The semiconductor package of claim 8, further comprising a second encapsulant around the first integrated circuit die and the second integrated circuit die, wherein the second encapsulant physically contacts the first integrated circuit die, the second integrated circuit die, the first interface die, and the second interface die.

14. A method comprising:
providing a first interposer comprising a first interconnect structure on a first interposer substrate;
bonding a first die to the first interconnect structure, wherein bonding the first die comprises directly bonding a first insulating layer of the first die to a bonding layer of the first interconnect structure and directly bonding a first die connector of the first die to a first bond pad of the first interconnect structure;
bonding a second die to the first interconnect structure, wherein bonding the second die comprises solder bonding a second die connector of the second die to a second bond pad of the first interconnect structure; and
encapsulating the first die and the second die in a molding compound.

15. The method of claim 14, further comprising:
forming a first under-bump metallization on the second bond pad;
forming a conductive connector on the first under-bump metallization; and
reflowing the conductive connector to bond the second die to the first interconnect structure.

16. The method of claim 14, further comprising planarizing the molding compound, the first die, and the second die.

17. The method of claim 14, further comprising forming an underfill material between the second die and the first interconnect structure, the underfill material surrounding solder joints formed between the second die and the first interconnect structure.

18. The method of claim 14, wherein the molding compound is formed surrounding solder joints formed between the second die and the first interconnect structure.

19. The method of claim 14, further comprising providing a second interposer adjacent the first interposer, the second interposer comprising a second interconnect structure on a second interposer substrate, wherein bonding the second die to the first interconnect structure bonds the second die to the second interconnect structure by solder bonding.

20. The method of claim 19, further comprising bonding a third die to the second interconnect structure, wherein bonding the third die comprises solder bonding a third die connector of the third die to a third bond pad of the second interconnect structure.

* * * * *